(12) United States Patent
Nakano et al.

(10) Patent No.: US 10,170,395 B2
(45) Date of Patent: Jan. 1, 2019

(54) SEMICONDUCTOR DEVICE AND A MANUFACTURING METHOD OF THE SEMICONDUCTOR DEVICE

(71) Applicant: FUJI ELECTRIC CO., LTD., Kanagawa (JP)

(72) Inventors: Hayato Nakano, Matsumoto (JP); Hideyo Nakamura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 45 days.

(21) Appl. No.: 15/417,245

(22) Filed: Jan. 27, 2017

(65) Prior Publication Data
US 2017/0263535 A1 Sep. 14, 2017

(30) Foreign Application Priority Data
Mar. 10, 2016 (JP) ................. 2016-046809

(51) Int. Cl.
*H01L 23/48* (2006.01)
*H02M 7/00* (2006.01)
*H05K 1/02* (2006.01)
*H01L 23/00* (2006.01)

(52) U.S. Cl.
CPC ............ *H01L 23/48* (2013.01); *H02M 7/003* (2013.01); *H05K 1/0213* (2013.01); *H01L 24/01* (2013.01)

(58) Field of Classification Search
CPC ........ H02G 5/005; H02G 5/002; H02G 15/00; H02G 5/00; H05K 2201/10272; H05K 1/0213; H02B 1/21; H02B 1/20; H01B 5/02; H01B 17/00; H01B 17/06; H01B 17/18; H01B 17/24; H01L 23/48; H01L 24/01; H02M 7/003
See application file for complete search history.

(56) References Cited

U.S. PATENT DOCUMENTS

| 7,656,672 B2* | 2/2010 | Schilling | H01L 24/49 361/736 |
| 2007/0109040 A1* | 5/2007 | Koh | G05F 3/262 327/543 |
| 2010/0232078 A1* | 9/2010 | Bhattacharya | H01L 27/0266 361/56 |
| 2010/0327842 A1* | 12/2010 | Seok | G05F 3/242 323/313 |

(Continued)

FOREIGN PATENT DOCUMENTS

JP 2003-142689 A 5/2003

*Primary Examiner* — Pete T Lee

(57) ABSTRACT

A semiconductor device including a semiconductor module 10A, a semiconductor module 10B that has a lower switching voltage threshold than the semiconductor module 10A, and busbars 331 and 32 that connect the semiconductor module 10A and the semiconductor module 10B in parallel to a common terminal. The semiconductor module 10B is connected at a connection point on the busbar 32 at which the inductance relative to the common terminal is higher than that of the semiconductor module 10A. The semiconductor module 10B with the low threshold voltage is turned ON faster than the semiconductor module 10A with the high threshold voltage for input of a common switching voltage, but can restrict the rising of the current due to the high inductance of the busbar 32, thereby enabling restriction of the current imbalance.

17 Claims, 19 Drawing Sheets

(56) References Cited

U.S. PATENT DOCUMENTS

| | | | |
|---|---|---|---|
| 2014/0355219 A1* | 12/2014 | Tada | H05K 1/0263 361/729 |
| 2016/0049629 A1 | 2/2016 | Matsuda | |
| 2016/0358895 A1* | 12/2016 | Nakashima | H01L 23/049 |
| 2017/0257022 A1* | 9/2017 | Bryant | H02M 1/34 |

* cited by examiner

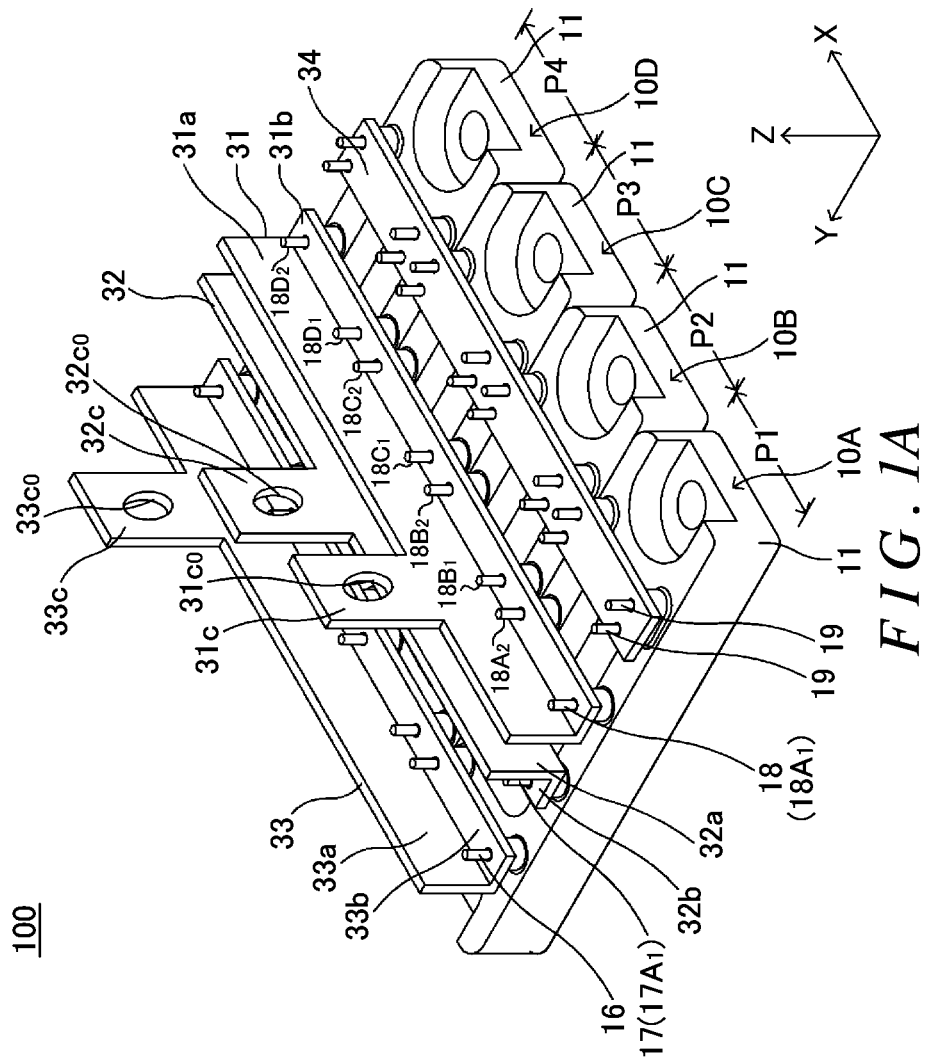

| OPTIMAL ARRANGEMENT | | | OFF | | | ON | |
|---|---|---|---|---|---|---|---|
| POSITION | L [nH] | MODULE | Vth [V] | Id [A] | Vgsp [V] | Vdsp [V] | Id [A] | Vgsp [V] |
| P1 | 11.8 | 10A | 2.89 | 119 | 9.5 | 849 | 84 | 22.1 |
| P2 | 7.4 | 10B | 2.96 | 128 | 10.8 | 866 | 112 | 24.0 |
| P3 | 3.9 | 10C | 3.30 | 82 | 10.6 | 860 | 94 | 21.7 |
| P4 | 1.9 | 10D | 3.51 | 108 | 10.5 | 853 | 128 | 23.1 |

| MAXIMIZED CURRENT IMBALANCE ARRANGEMENT | | | | OFF | | | ON | |
|---|---|---|---|---|---|---|---|---|
| POSITION | L [nH] | MODULE | Vth [V] | Id [A] | Vgsp [V] | Vdsp [V] | Id [A] | Vgsp [V] |
| P1 | 11.8 | 10D | 3.51 | 78 | 17.8 | 895 | 61 | 25.1 |
| P2 | 7.4 | 10C | 3.30 | 98 | 13.9 | 886 | 93 | 23.5 |
| P3 | 3.9 | 10B | 2.96 | 130 | 13.6 | 882 | 125 | 23.3 |
| P4 | 1.9 | 10A | 2.89 | 135 | 20.9 | 888 | 149 | 29.8 |

SEMICONDUCTOR DEVICE AND A MANUFACTURING METHOD OF THE SEMICONDUCTOR DEVICE

The contents of the following Japanese patent application are incorporated herein by reference:
NO. 2016-046809 filed on Mar. 10, 2016.

BACKGROUND

1. Technical Field

The present invention relates to a semiconductor device and a semiconductor device manufacturing method.

2. Related Art

In recent years, development has progressed for power semiconductor modules (referred to simply as "semiconductor modules") in which are mounted next-generation semiconductor elements such as compound semiconductor elements including silicon carbide (SiC) compound semiconductor elements and the like. An SiC element has a high withstand voltage compared to a conventional silicon (Si) semiconductor element due to having high insulation breakdown electric field strength, and it is possible to realize a miniature semiconductor module that is capable of high speed operation and has high efficiency because it is possible to make the impurity concentration higher and the active layer thinner.

The semiconductor module can use a busbar such as disclosed in Patent Document 1 or uses wiring such as disclosed in Patent Document 2, for example, to connect a plurality of modules in parallel, thereby realizing high capacitance, i.e. a large current.

Patent Document 1: Japanese Patent Application Publication No. 2014-236150

Patent Document 2: Japanese Patent Application Publication No. 2003-142689

However, miniaturization of next-generation semiconductor elements is progressing and the inductance of conductors connecting semiconductor modules in parallel, such as a busbar or wiring, is getting larger compared to the internal inductance of the semiconductor modules. Accordingly, due to variations in the inductances of the busbars, wiring, and the like for each semiconductor module, a current imbalance occurs, such as variation in the transient characteristics of the current output from each semiconductor module, e.g. the rising time, the maximum current, and the like. Until recently, it was possible to cause a busbar to have a low inductance by positioning two output lines of a semiconductor module (the P line and the N line described further below) close to each other, i.e. by using mutual inductance. However, in such a case as well, the same current imbalance occurs due to the variation in inductance from the common terminal of the busbar to each module and the semiconductor element inside each module, caused by the differences in the current paths for each semiconductor module. Since a next-generation semiconductor element operates at high speed, there is a problem that the current imbalance causes an imbalance among the switching speeds of the semiconductor modules and stress is focused on the semiconductor element in a prescribed module, thereby lowering the reliability of all of the modules.

SUMMARY

According to a first aspect of the present invention, provided is a semiconductor device comprising a first semiconductor module; a second semiconductor module housing a second semiconductor element that has a switching voltage threshold that is lower than a switching voltage threshold of a first semiconductor element of the first semiconductor module; and a busbar that connects respective external terminals of the first semiconductor module and the second semiconductor module in parallel to a common terminal, wherein the second semiconductor module is connected to a connection point on the busbar at which an inductance of a current path to the common terminal is greater than an inductance of a current path from a connection point of the first semiconductor module to the common terminal.

According to a second aspect of the present invention, provided is a method of manufacturing the semiconductor device according to the first aspect, comprising measuring the switching voltage threshold of each semiconductor element housed in a plurality of the semiconductor modules; selecting a first semiconductor element housed in the first semiconductor module from among the plurality of semiconductor elements and selecting a second semiconductor element with a lower switching voltage threshold than the first semiconductor element housed in the first semiconductor module to be housed in the second semiconductor module; connecting the first semiconductor module to a connection point on the busbar; and connecting the second semiconductor module to a connection point on the busbar at which an inductance relative to the common terminal is higher than that of the first semiconductor module.

According to a third aspect of the present invention, provided is a semiconductor device comprising a first semiconductor module and a second semiconductor module that each include a first semiconductor element connected between a first external terminal and a second external terminal and a second semiconductor element connected between the second external terminal and a third external terminal; a first busbar that connects the first external terminal of the first semiconductor module and the first external terminal of the second semiconductor module in parallel to a first common terminal; a second busbar that connects the second external terminal of the first semiconductor module and the second external terminal of the second semiconductor module in parallel to a second common terminal; and a third busbar that connects the third external terminal of the first semiconductor module and the third external terminal of the second semiconductor module in parallel to a third common terminal, wherein the first semiconductor element of the first semiconductor module has a higher switching voltage threshold than the first semiconductor element of the second semiconductor module, the second semiconductor element of the first semiconductor module has a lower switching voltage threshold than the second semiconductor element of the second semiconductor module, an inductance of a current path from the first common terminal to the first semiconductor element in the first semiconductor module is lower than an inductance of a current path from the first common terminal to the first semiconductor element in the second semiconductor module, and an inductance of a current path from the third common terminal to the second semiconductor element of the first semiconductor module is higher than an inductance of a current path from the third common terminal to the second semiconductor element of the second semiconductor module.

According to a fourth aspect of the present invention, provided is a method of manufacturing the semiconductor device according to the third aspect, comprising measuring the switching voltage threshold of each semiconductor element housed in a plurality of the semiconductor modules;

selecting, from among the plurality of semiconductor elements, a first semiconductor element housed in the first semiconductor module and a second semiconductor element housed in the first semiconductor module, a first semiconductor element with a lower switching voltage threshold than the first semiconductor element housed in the first semiconductor module to be housed in the second semiconductor module, and a second semiconductor element with a higher switching voltage threshold than the second semiconductor element housed in the first semiconductor module to be housed in the second semiconductor module; connecting the first external terminal of the first semiconductor module to the first busbar and connecting the third external terminal of the first semiconductor module to the third busbar; and connecting the first external terminal of the second semiconductor module to the first busbar and connecting the third external terminal of the second semiconductor module to the third busbar, wherein an inductance of a current path from the first common terminal to the first semiconductor element in the first semiconductor module is made lower than an inductance of a current path to the second semiconductor element in the second semiconductor module, and an inductance of a current path from the third common terminal to the second semiconductor element of the first semiconductor module is made higher than an inductance of a current path from the third common terminal to the second semiconductor element of the second semiconductor module.

According to a fifth aspect of the present invention, provided is a semiconductor device comprising a first semiconductor module and a second semiconductor module that each include a first semiconductor device connected between a first external terminal and a second external terminal and a second semiconductor device connected between the second external terminal and a third external terminal; a first busbar that connects the first external terminal of the first semiconductor module and the first external terminal of the second semiconductor module in parallel to a first common terminal; a second busbar that connects the third external terminal of the first semiconductor module and the third external terminal of the second semiconductor module in parallel to a second common terminal, wherein the first semiconductor device of the first semiconductor module has a higher switching voltage threshold than the first semiconductor device of the second semiconductor module, the second semiconductor device of the first semiconductor module has a lower switching voltage threshold than the second semiconductor device of the second semiconductor module, and an inductance of a current path from the first common terminal to the second common terminal through the first semiconductor device in the first semiconductor module and the second semiconductor device in the second semiconductor module is lower than an inductance of a current path from the first common terminal to the second common terminal through the first semiconductor device in the second semiconductor module and the second semiconductor device in the first semiconductor module.

According to a sixth aspect of the present invention, provided is a method of manufacturing the semiconductor device according to the fifth aspect, comprising measuring the switching voltage threshold of the first semiconductor device and the second semiconductor device included in each of a plurality of the semiconductor modules; selecting, from among the plurality of semiconductor modules, a first semiconductor module and selecting a second semiconductor module in which the first semiconductor device has a lower switching voltage threshold than the first semiconductor module and the second semiconductor device has a higher switching voltage threshold than the first semiconductor module; connecting the first external terminal of the first semiconductor module to the first busbar and connecting the third external terminal of the first semiconductor module to the second busbar; and connecting the first external terminal of the second semiconductor module to the first busbar and connecting the third external terminal of the second semiconductor module to the second busbar, wherein an inductance of a current path from the first common terminal to the second common terminal through the first semiconductor device in the first semiconductor module and the second semiconductor device in the second semiconductor module is made lower than an inductance of a current path from the first common terminal to the second common terminal through the first semiconductor device in the second semiconductor module and the second semiconductor device in the first semiconductor module.

The summary clause does not necessarily describe all necessary features of the embodiments of the present invention. The present invention may also be a sub-combination of the features described above.

BRIEF DESCRIPTION OF THE DRAWINGS

FIG. 1A shows a configuration of a semiconductor device according to the present embodiment.

FIG. 9A shows an example of results of a current imbalance test (measurement results for the largest drain current, the largest gate-source voltage, and the largest drain-source voltage when the conduction is ON and when the conduction is OFF) for the semiconductor device in which the semiconductor modules have the optimal arrangement.

FIG. 10A shows an example of results of a current imbalance test (measurement results for the largest drain current, the largest gate-source voltage, and the largest drain-source voltage when the conduction is ON and when the conduction is OFF) for the semiconductor device according to the comparative example.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1B:
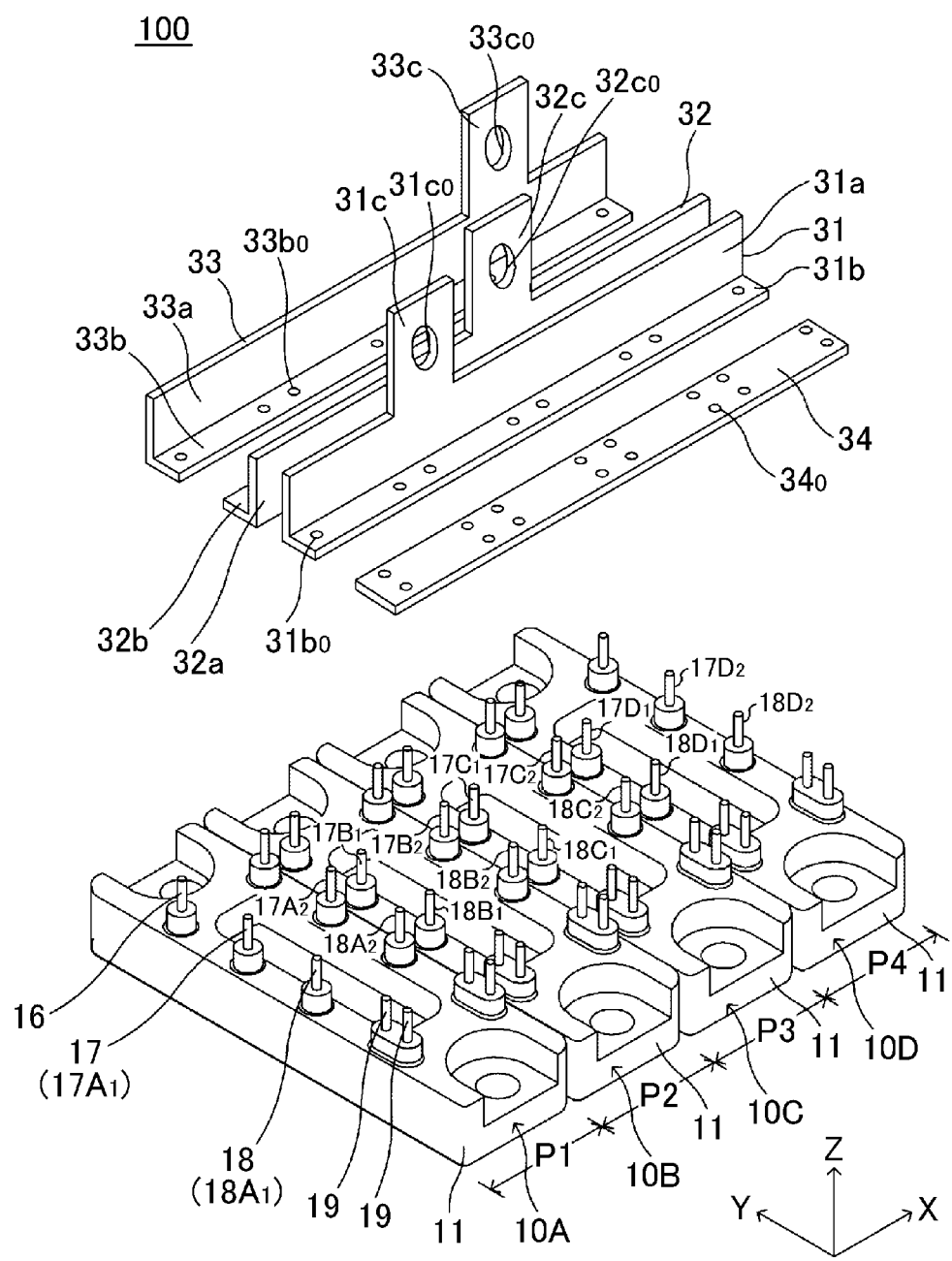
FIG. 1B shows a configuration of a semiconductor device according to the present embodiment in a state where the semiconductor module and the busbar are exploded.

FIGS. 1A and 1B show a configuration of a semiconductor device 100 according to the present embodiment (FIG. 1B shows a state where the semiconductor module and the busbar are exploded). The semiconductor device 100 includes semiconductor modules 10A to 10D, busbars 31 to 33, and a print substrate 34 in order to restrict an imbalance of the currents output from the respective semiconductor modules by optimizing the parallel arrangement of the semiconductor modules based on the characteristics of the semiconductor modules connected by the busbars and the inductances of the busbars.

The semiconductor device 100 is used by being incorporated as an inverter corresponding to one phase of a motor, e.g. a U phase, in an external apparatus or system (referred to as an "external apparatus or the like," and not shown in the drawings), e.g. an inverter apparatus driving a motor, and operates according to a control signal from the external apparatus, such as a switching voltage. In the semiconductor device 100, the positions where the semiconductor modules 10A to 10D are each arranged relative to the busbars 31 to 33 are referred to as sites P1 to P4. The sites P1 to P4 are arranged in the X direction below the busbars 31 to 33.

In this Specification, the term "connect" is not particularly limited, and includes a meaning of being electrically connected in a manner enabling electrical conduction.

Each of the semiconductor modules 10A to 10D is a switching apparatus that receives a switching voltage and outputs current, i.e. conducts electricity. Here, each of the semiconductor modules 10A to 10D has a unique threshold voltage, and receives a switching voltage greater than or equal to the threshold voltage to conduct electricity between two external terminals or receives a switching voltage less than the threshold voltage to stop conducting electricity. (Instead, each of the semiconductor modules 10A to 10D may receive a switching voltage less than the threshold voltage to conduct electricity between two external terminals or receive a switching voltage greater than or equal to the threshold voltage to stop conducting electricity). The semiconductor modules 10A to 10D are arranged in parallel in the X direction at the respective sites P1 to P4, and are connected in parallel by the busbars 31 to 33 described further below. In the present embodiment, four semiconductor modules are arranged in parallel as an example, but the number of semiconductor modules is not limited to four and may be any arbitrary number greater than one.

Each of the semiconductor modules 10A to 10D includes one or more (two in this case) of each of an external terminal 16, an external terminal 17, and an external terminal 18, and also includes one or more (four in this case) external terminals 19. Here, the semiconductor module 10A includes two external terminals 17 ($17A_1$ and $17A_2$) and two external terminals 18 ($18A_1$ and $18A_2$). The semiconductor module 10B includes two external terminals 17 ($17B_1$ and $17B_2$) and two external terminals 18 ($18B_1$ and $18B_2$). The semiconductor module 10C includes two external terminals 17 ($17C_1$ and $17C_2$) and two external terminals 18 ($18C_1$ and $18C_2$). The semiconductor module 10D includes two external terminals 17 ($17D_1$ and $17D_2$) and two external terminals 18 ($18D_1$ and $18D_2$). Detailed configurations of the semiconductor modules 10A to 10D are described further below.

The busbars 31 to 33 are conductors that connect the semiconductor modules 10A to 10D in parallel with each common terminal. The busbars 31 to 33 are arranged in parallel in the Y direction and each have a longitudinal direction in the X direction. The busbar 31 is connected to the set of two external terminals 18 of each of the semiconductor modules 10A to 10D, i.e. the external terminals $18A_1$, $18A_2$, $18B_1$, $18B_2$, $18C_1$, $18C_2$, $18D_1$, and $18D_2$. In the circuit configuration of the semiconductor device 100, the portion formed by the busbar 31 connected to these external terminals is also referred to as a P line, i.e. a positive terminal. The busbar 32 is connected to the set of two external terminals 17 of each of the semiconductor modules 10A to 10D, i.e. the external terminals $17A_1$, $17A_2$, $17B_1$, $17B_2$, $17C_1$, $17C_2$, $17D_1$, and $17D_2$. In the circuit configuration of the semiconductor device 100, the portion formed by the busbar 32 connected to these external terminals is also referred to as an N line, i.e. a negative terminal. The busbar 33 is connected to the set of two external terminals 16 of each of the semiconductor modules 10A to 10D. In the circuit configuration of the semiconductor device 100, the portion formed by the busbar 33 connected to these external terminals is also referred to as a U line. The detailed configuration of the busbars 31 to 33 is described further below.

The print substrate 34 is a substrate that is connected to the semiconductor modules 10A to 10D, inputs a control signal transmitted from the external apparatus or the like to each semiconductor module, and transmits an output signal output from each semiconductor module to the external apparatus or the like. The print substrate 34 is arranged on the −Y side of the busbar 31, has a longitudinal direction oriented in the X direction, and is connected to the four external terminals 19 of each of the semiconductor modules 10A to 10D. The detailed configuration of the print substrate 34 is described further below.

The semiconductor device 100 may further include a case (not shown) that covers the semiconductor modules 10A to 10D, the busbars 31 to 33, and the print substrate 34 from above to house these components therein.

Figure 2A:
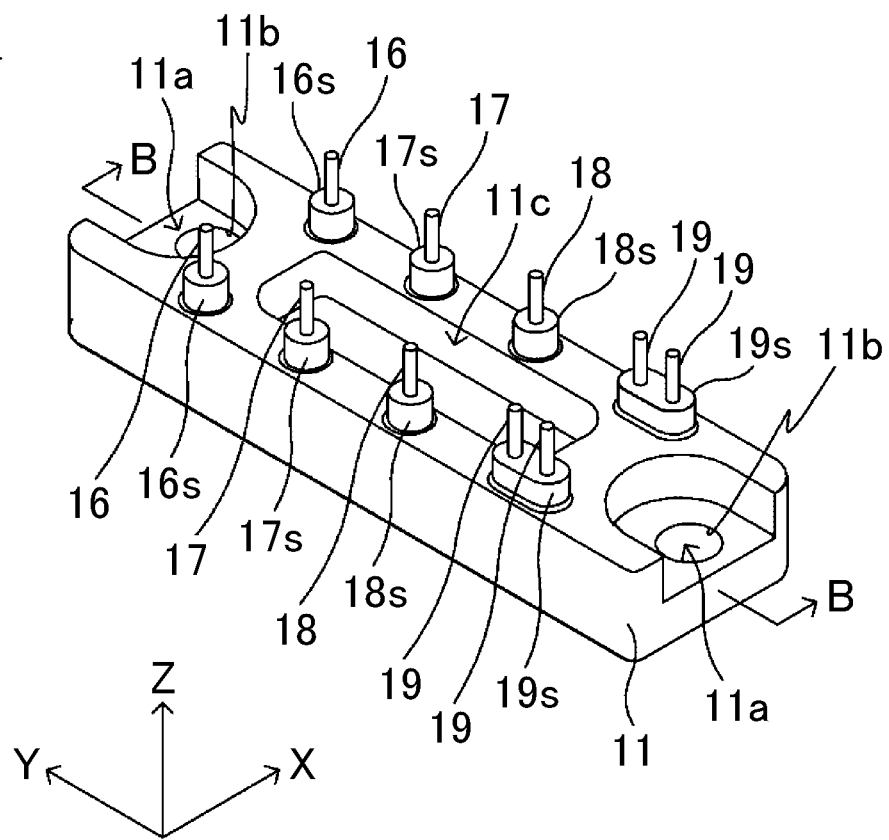
FIG. 2A shows an external configuration of a semiconductor module.
Figure 2B:
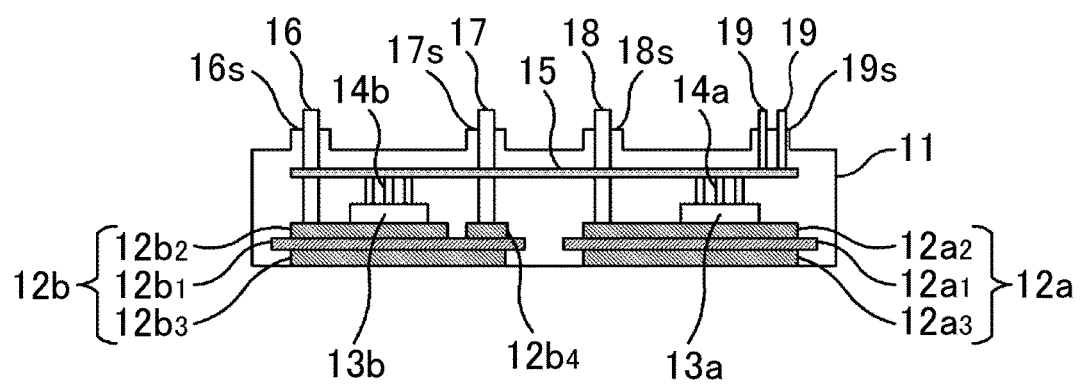
FIG. 2B shows an internal configuration of a semiconductor module.

FIGS. 2A and 2B respectively show an external configuration and an internal configuration of a semiconductor module 10. FIG. 2B shows a cross-sectional configuration of the semiconductor module 10A relating to the reference line BB shown in FIG. 2A. The semiconductor module 10A includes a body 11, substrates 12a and 12b, semiconductor elements 13a and 13b, conducting posts 14a and 14b, a wiring substrate 15, external terminals 16 to 18, and external terminals 19.

The body 11 is a sealing member that houses therein each configurational component of the semiconductor module 10A, with the top ends of the external terminals 16 to 19 protruding above the body 11 and the bottom surface of the substrates 12a and 12b being exposed in the same surface as the bottom surface of the body 11. The body 11 is formed to have a substantially rectangular shape with the longitudinal direction being the Y direction, by performing molding using a thermosetting resin such as epoxy resin, for example.

Here, a stepped portion 11a having a substantially semicircular shape in an overhead view and a hole 11b penetrating through the stepped portion 11a in the Z direction are formed at each end of the body 11 in the Y direction. By inserting a securing jig such as a bolt into each hole 11b from above, it is possible to secure the semiconductor module 10A to the external apparatus or the like.

Furthermore, a concave portion 11c extending in the Y direction is formed in the center of the top surface of the body 11, and three cylindrical convex portions 16s to 18s and one single-core cylindrical convex portion 19s are arranged in the Y direction on each of one side and another side of the concave portion 11c in the X direction in a manner to sandwich the concave portion 11c. External terminals 16 to 18 protrude upward respectively from the top surfaces of the convex portions 16s to 18s, and two external terminals 19 protrude upward from the top surface of each convex portion 19s.

The substrates 12a and 12b are members on which semiconductor elements are implemented, and a DCB (Direct Copper Bonding) substrate, an AMB (Active Metal Blazing) substrate, or the like can be adopted as the substrates 12a and 12b, for example.

The substrate 12a includes an insulating board $12a_1$ and circuit layers $12a_2$ and $12a_3$. The insulating board $12a_1$ is a board-shaped member formed from an insulating ceramic such as aluminum nitride, silicon nitride, or aluminum oxide, for example. The circuit layers $12a_2$ and $12a_3$ are provided respectively on the top surface and the bottom surface of the insulating board $12a_1$, using a conductive metal such as copper or aluminum, for example. The circuit layer $12a_2$ includes a wiring pattern connected to the semiconductor elements.

The substrate 12b includes an insulating board $12b_1$ and circuit layers $12b_2$, $12b_3$, and $12b_4$. The insulating board $12b_1$ and the circuit layers $12b_2$ and $12b_3$ are each formed in the same manner as the insulating board $12a_1$ and the circuit layers $12a_2$ and $12a_3$ of the substrate 12a. The circuit layer $12b_4$ is provided along with the circuit layer $12b_2$ on the top surface of the insulating board $12b_1$, using a conductive metal such as copper or aluminum, for example.

The semiconductor elements 13a and 13b are switching elements made of a compound semiconductor such as SiC, for example, and an insulated gate bipolar transistor (IGBT), a vertical metal oxide field effect transistor (MOSFET), or the like having an electrode on each of the front surface and the back surface can be adopted as the semiconductor elements 13a and 13b. The semiconductor elements 13a and 13b are not limited to being vertical elements, and may be horizontal elements having electrodes provided only on the front surface. The semiconductor elements 13a and 13b are respectively implemented on the substrates 12a and 12b.

If the semiconductor elements 13a and 13b are MOSFETs (or IGBTs), a source electrode (emitter electrode) and a gate electrode are included on the front surface and a drain electrode (collector electrode) is included on the back surface. The semiconductor elements 13a and 13b are affixed respectively on the substrates 12a and 12b via the back surfaces of the semiconductor elements, by connecting the drain electrodes (or collector electrodes) respectively to the circuit layers $12a_2$ and $12b_2$ with a bonding material such as solder.

The conducting posts 14a and 14b are conductive members provided respectively between the semiconductor elements 13a and 13b and the wiring substrate 15 to conduct electricity therebetween, and are formed with pillar shapes using a conductive metal such as copper or aluminum, for example. The conducting posts 14a and 14b are established respectively on and connected to the semiconductor elements 13a and 13b using a bonding material such as solder on the bottom ends of the conducting posts 14a and 14b, and the top ends of the conducting posts 14a and 14b are connected to the wiring pattern on the wiring substrate 15 using solder, wax, or caulk.

The conducting post 14a (14b) includes three posts. Two of these three posts are established on the source electrode of the semiconductor element 13a (13b) or an electrode connected to the semiconductor element 13a (13b), and are connected to the wiring pattern on the wiring substrate 15. The remaining one post is established on the gate electrode of the semiconductor element 13a (13b) or an electrode connected to the semiconductor element 13a (13b), and is connected to the wiring pattern on the wiring substrate 15.

The wiring substrate 15 is a substrate connecting the electrodes of the semiconductor elements 13a and 13b to the external terminals 16 to 19, and includes an insulating board (not shown) and a circuit layer (not shown) having a wiring pattern formed on the front surface thereof. A rigid substrate formed from a glass epoxy material or the like, or a flexible substrate formed from polyimide material or the like, for example, can be adopted as the insulating board. A plurality of through-holes (not shown) passing through the conducting posts 14a and 14b and the external terminals 16 to 18 are provided in the insulating board. The circuit layer is provided on the front surface of the insulating board, using a conductive metal such as copper or aluminum.

The wiring pattern of the wiring substrate 15 connects the conducting posts 14a and 14b, which are connected to the gate electrodes of the semiconductor elements 13a and 13b, to one external terminal 19; connects the conducting post 14a, which is connected to the source electrode of the semiconductor element 13a, to the external terminals 16, and connects the conducting post 14b, which is connected to the source electrode of the semiconductor element 13b, to the external terminals 17.

The external terminals 16 to 18 are terminals for conducting current output from the semiconductor elements 13a and 13b and outputting this current to the outside of the semiconductor module 10A. The external terminals 16 to 18 are formed as cylindrical pillars or square pillars, using a conductive metal such as copper or aluminum, for example.

The external terminals 16 include two terminals, are established on the circuit layer $12b_2$ of the substrate 12b, extend upward through holes (not shown) in the wiring substrate 15, and protrude from the convex portions 16s on the top surface of the body 11. The external terminals 16 are connected to the drain electrode of the semiconductor element 13b via the circuit layer $12b_2$ and to the source electrode of the semiconductor element 13a via the wiring pattern of the wiring substrate 15 and the conducting post 14a, and function as output terminals.

The external terminals 17 include two terminals, i.e. the external terminals $17A_1$ and $17A_2$, are established on the circuit layer $12b_4$ of the substrate 12b, extend upward through holes (not shown) in the wiring substrate 15, and protrude from the convex portions 17s on the top surface of the body 11. The external terminals 17 are connected to the source electrode of the semiconductor element 13b via the wiring pattern of the wiring substrate 15 and the conducting post 14b, and function as source terminals.

The external terminals 18 include two terminals, i.e. the external terminals $18A_1$ and $18A_2$, are established on the circuit layer $12a_2$ of the substrate 12a, extend upward through holes (not shown) in the wiring substrate 15, and protrude from the convex portions 18s on the top surface of the body 11. The external terminals 18 are connected to the drain electrode of the semiconductor element 13a via the circuit layer $12a_2$, and function as drain terminals.

The external terminals 19 are terminals for inputting a control signal to the semiconductor elements 13a and 13b from outside the semiconductor module 10A. The external terminals 19 are each formed with a cylindrical pillar shape using a conductive metal such as copper or aluminum, for example, in the same manner as the external terminals 16 to 18.

The external terminals 19 include four terminals, are established on the wiring pattern of the wiring substrate 15, and protrude from the convex portions 19s on the top surface of the body 11. At least one terminal among the four external terminals 19 is connected to the gate electrodes of the semiconductor elements 13a and 13b via the wiring pattern of the wiring substrate 15 and the conducting posts 14a and 14b, and functions as a gate terminal.

Figure 3:
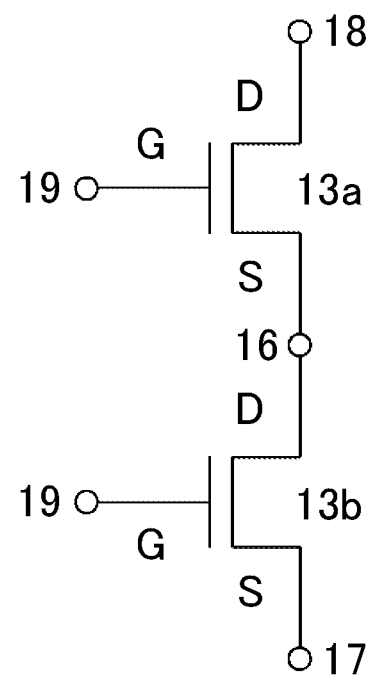
FIG. 3 shows a circuit configuration of a semiconductor module.

FIG. 3 shows a circuit configuration of the semiconductor module 10A. In the semiconductor module 10A, the semiconductor elements 13a and 13b are connected in series between the external terminals 18 and 17, via the circuit layers $12a_2$ and $12b_2$, the conducting posts 14a and 14b, the wiring pattern of the wiring substrate 15, and the external terminal 16. The semiconductor elements 13a and 13b are turned ON and OFF by inputting the control signal (a switching signal included therein) to each gate electrode via the external terminal 19, and conduct current or stop conduction from the external terminals 18 to the external terminals 16 or from the external terminals 16 to the external terminals 17.

The semiconductor modules 10B to 10D are configured in the same manner as the semiconductor module 10A.

The semiconductor modules 10A to 10D according to the present embodiment each include two semiconductor elements 13a and 13b arranged in series, but the number of semiconductor elements is not limited to 2, and may instead be 1 or 3 or more. Furthermore, a plurality of semiconductor elements may be arranged in parallel in a single module.

Figure 4:
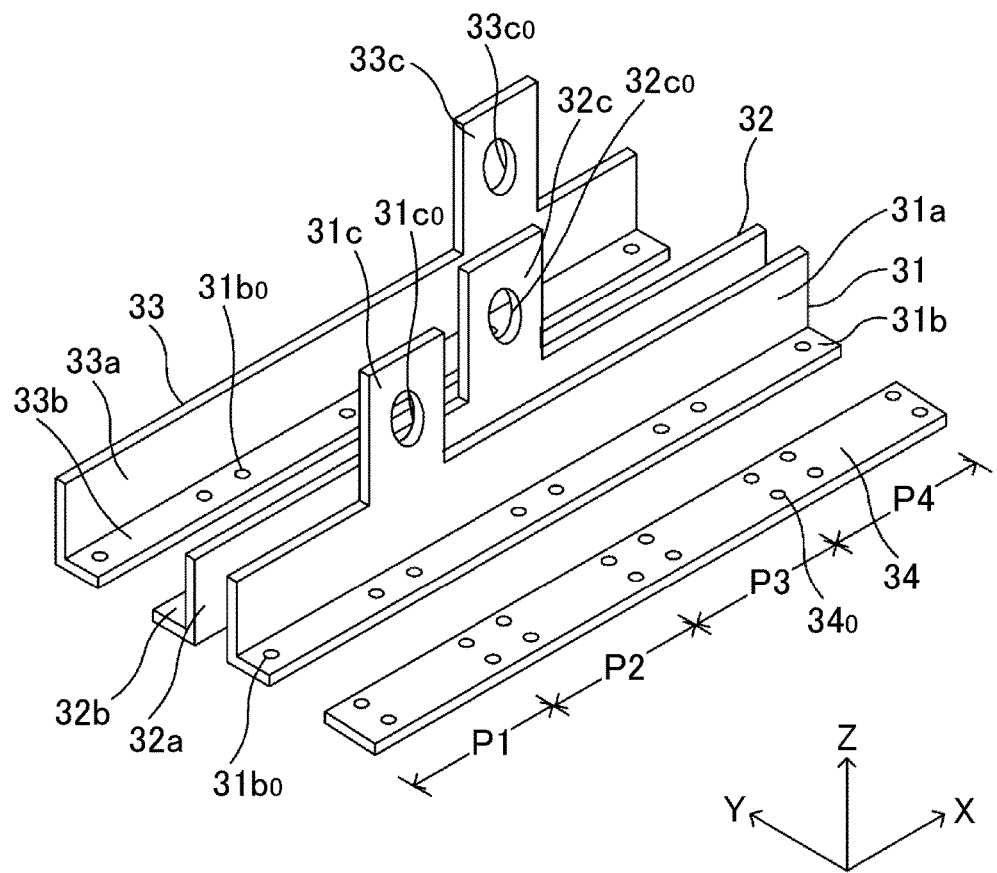
FIG. 4 shows configuration of a busbar and the print substrate.

FIG. 4 shows a configuration of the busbars 31 to 33 and the print substrate 34.

The busbar 31 is formed with an L shape as seen in a side view, using a conductive metal such as copper or aluminum, for example. The busbar 31 includes a body portion 31a, a bonding portion 31b, and a terminal portion 31c. The body portion 31a is a portion for conducting electricity between a terminal bonded to the bonding portion 31b and the terminal portion 31c. The body portion 31a stands in the Z direction with a longitudinal direction in the X direction. The bonding portion 31b is a portion that has one edge connected to a bottom edge of the body portion 31a and another edge that curves from the body portion 31a toward the −Y direction. Eight holes $31b_0$ are formed in the bonding portion 31b, with two of these holes at each position corresponding to one of the sites P1 to P4 serving as connection points for connecting to the external terminals 18. The terminal portion 31c is a portion that extends in the +Z direction from the top edge of the body portion 31a. The terminal portion 31c has a width that is sufficiently less than the longitudinal length of the body 11, and is provided on the top end of the body portion 31a positioned directly above the site P2. A circular opening $31c_0$ is formed in the center of the terminal portion 31c.

The busbar 31 is connected to the set of two external terminals 18 of each of the semiconductor modules 10A to 10D, i.e. the external terminals $18A_1$, $18A_2$, $18B_1$, $18B_2$, $18C_1$, $18C_2$, $18D_1$, and $18D_2$. On the semiconductor modules 10A to 10D, each set of two external terminals 18 passes respectively through two of the eight holes $31b_0$ of the bonding portion 31b and contacts the bonding portion 31b on the top surface of each set of two convex portions 18s to support the busbar 31. In this state, the external terminals 18 are bonded to the bonding portion 31b via a bonding material such as solder or by laser welding, for example. In this way, the terminal portion 31c is connected to the external terminals 18 (functioning as the drain terminals) of the semiconductor modules 10A to 10D, to function as a common terminal.

The busbar 32 is configured in the same manner as the busbar 31, and includes a body portion 32a, a bonding portion 32b, and a terminal portion 32c. The body portion 32a stands in the Z direction with a longitudinal direction in the X direction. The bonding portion 32b has one edge connected to a bottom edge of the body portion 32a and another edge that curves from the body portion 32a toward the +Y direction. Eight holes $32b_0$ are formed in the bonding portion 32b, with two of these holes at each position corresponding to one of the sites P1 to P4 serving as connection points for connecting to the external terminals 17. The terminal portion 32c is provided on the top end of the body portion 32a positioned directly above the site P3. A circular opening $32c_0$ is formed in the center of the terminal portion 32c.

The busbar 32 is arranged such that the bonding portion 32b is oriented on the +Y side and is close to the busbar 31 on the +Y side, and one surface of the body portion 32a faces one surface of the body portion 31a of the busbar 31. Here, in the semiconductor device 100, the current flows in opposite directions for the busbars 31 and 32, i.e. the current flows from the terminal portion 31c downward (−Z direction) toward the bonding portion 31b in the busbar 31 and flows from the bonding portion 32b upward (+Z direction) toward the terminal portion 32c in the busbar 32, or the current flows from the terminal portion 32c downward (−Z direction) toward the bonding portion 32b in the busbar 32 and flows from the bonding portion 31b upward (+Z direction) toward the terminal portion 31c in the busbar 31. Therefore, the self-inductances of the busbars 31 and 32 are reduced by mutual inductance.

The busbar 32 is connected to the set of two external terminals 17 of each of the semiconductor modules 10A to 10D, i.e. the external terminals $17A_1$, $17A_2$, $17B_1$, $17B_2$, $17C_1$, $17C_2$, $17D_1$, and $17D_2$. On the semiconductor modules 10A to 10D, each set of two external terminals 17 passes respectively through two of the eight holes $32b_0$ of the bonding portion 32b and contacts the bonding portion 32b on the top surface of each set of two convex portions 17s to support the busbar 32. In this state, the external terminals 17 are bonded to the bonding portion 32b via a bonding material such as solder or by laser welding, for example. In this way, the terminal portion 32c is connected to the external terminals 17 (functioning as the source terminals) of the semiconductor modules 10A to 10D, to function as a common terminal.

The busbar 33 is configured in the same manner as the busbar 31, and includes a body portion 33a, a bonding portion 33b, and a terminal portion 33c. The body portion 33a stands in the Z direction with a longitudinal direction in the X direction. The bonding portion 33b is a portion that has one edge connected to a bottom edge of the body portion 33a and another edge that curves from the body portion 33a toward the −Y direction. Eight holes $33b_0$ are formed in the bonding portion 33b, with two of these holes at each position corresponding to one of the sites P1 to P4 serving as connection points for connecting to the external terminals 16. The terminal portion 33c is provided on the top end of the body portion 33a positioned directly above the site P4. A circular opening $33c_0$ is formed in the center of the terminal portion 33c. The busbar 33 is configured in the same manner as the busbar 31, except for the position of the terminal portion 33c being different, and the bonding portion 33b is arranged to be oriented toward the −Y side on the +Y side of the busbar 32.

The busbar 33 is connected to the set of two external terminals 16 of each of the semiconductor modules 10A to 10D. On the semiconductor modules 10A to 10D, each set of two external terminals 16 passes respectively through two of the eight holes $33b_0$ of the bonding portion 33b and contacts the bonding portion 33b on the top surface of each set of two convex portions 16s to support the busbar 33. In this state, the external terminals 16 are bonded to the bonding portion 33b by laser welding, for example. In this way, the terminal portion 33c is connected to the external terminals 16 (functioning as the output terminals) of the semiconductor modules 10A to 10D, to function as a common terminal.

The print substrate 34 includes an insulating board (not shown) that has a longitudinal direction in the X direction, and a circuit layer (not shown) that has a wiring pattern formed on the front surface thereof. A rigid substrate formed from a glass epoxy material or a flexible substrate formed from polyimide material or the like, for example, can be adopted as the insulating board. Sixteen holes $34_0$ are formed in the insulating board. A circuit layer is provided on the front surface of the insulating board, using a conductive metal such as copper or aluminum.

The print substrate 34 is connected to the set of four external terminals 19 of each of the semiconductor modules 10A to 10D. On the semiconductor modules 10A to 10D, each set of four external terminals 19 passes respectively through four of the sixteen holes $34_0$ and contacts the top surface of each set of two convex portions 19s to support the print substrate 34. In this state, the external terminals 19 are bonded to the print substrate 34 via a bonding material such as solder, for example. In this way, control signals including switching voltages can be input from the external apparatus or the like to the semiconductor elements 13a and 13b in the semiconductor modules 10A to 10D, via the wiring pattern on the print substrate 34.

Figure 5:
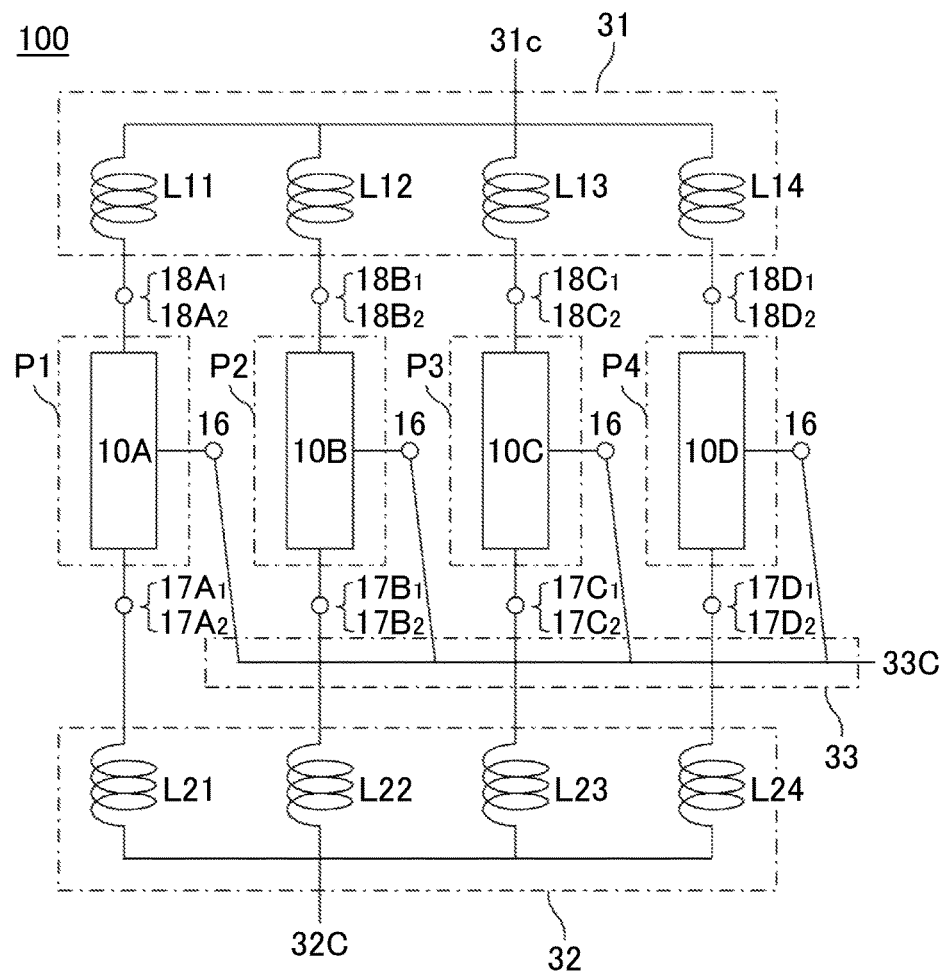
FIG. 5 shows a circuit configuration of the semiconductor device.

FIG. 5 shows the circuit configuration of the semiconductor device 100 configured as described above, specifically the parallel circuit configuration of the semiconductor modules 10A to 10D using the busbars 31 to 33. The busbar 31 has parasitic inductances L11 to L14 between the terminal portion 31c and respective connection points on the bonding portion 31b to which are connected the sets of two external terminals 18 of each of the semiconductor modules 10A to 10D arranged respectively at the sites P1 to P4, i.e. the external terminals $18A_1$ and $18A_2$, $18B_1$ and $18B_2$, $18C_1$ and $18C_2$, and $18D_1$ and $18D_2$. The busbar 32 has parasitic inductances L21 to L24 between the terminal portion 32c and respective connection points on the bonding portion 32b to which are connected the sets of two external terminals 17 of each of the semiconductor modules 10A to 10D arranged respectively at the sites P1 to P4, i.e. the external terminals $17A_1$ and $17A_2$, $17B_1$ and $17B_2$, $17C_1$ and $17C_2$, and $17D_1$ and $17D_2$.

By expressing the inductances of the busbars 31 and 32 using the inductances L11 to L14 and L21 to L24, the semiconductor device 100 is expressed as a circuit in which the inductances L11 and L21 are arranged in series and sandwiched in the semiconductor module 10A, the inductances L12 and L22 are arranged in series and sandwiched in the semiconductor module 10B, the inductances L13 and L23 are arranged in series and sandwiched in the semiconductor module 10C, and the inductances L14 and L24 are arranged in series and sandwiched in the semiconductor module 10D, and each of these series of inductances is arranged in parallel between the terminal portion 31c of the busbar 31 and the terminal portion 32c of the busbar 32.

Figure 6:
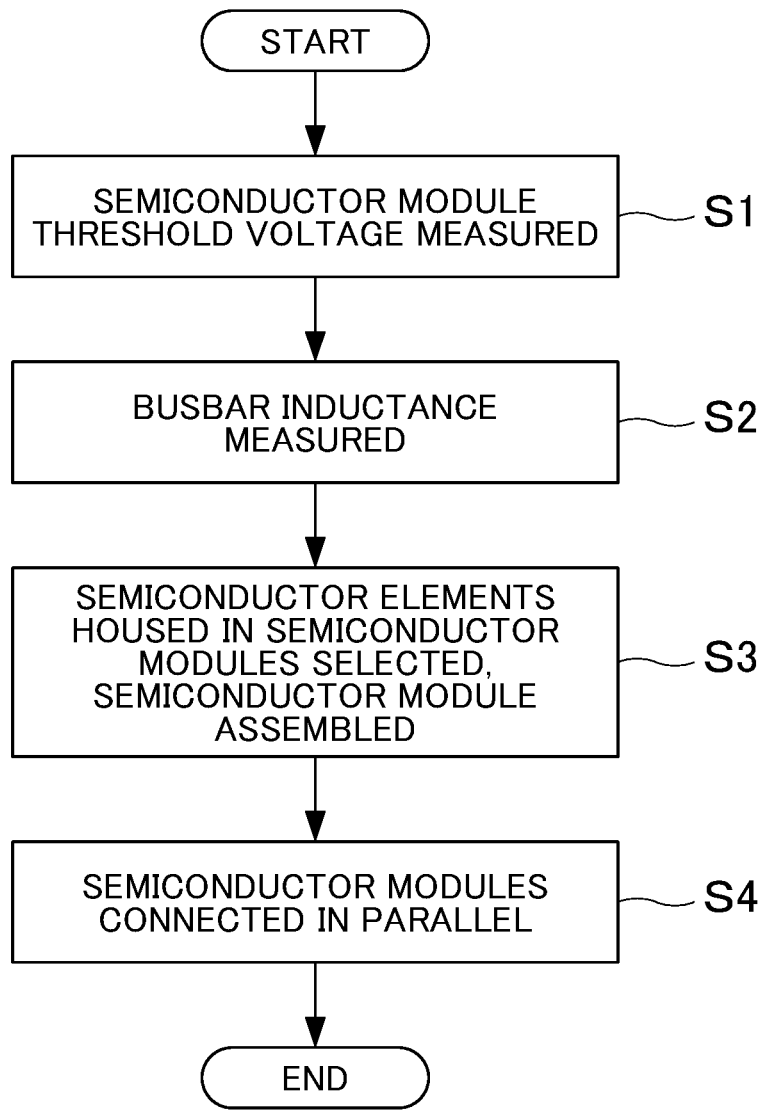
FIG. 6 shows a flow of a manufacturing method of the semiconductor device.

FIG. 6 shows the flow of a manufacturing method of the semiconductor device 100.

In step S1, a threshold voltage $V_{th}$ for the switching voltage is measured for each of the semiconductor elements 13a and 13b implemented in the semiconductor modules 10A to 10D.

The threshold voltage $V_{th}$ of the semiconductor elements 13a and 13b is measured in the following manner, for example. A voltage of 20 V, for example, (i.e. a drain-source voltage $V_{DS}$) is applied between the drain electrode and the source electrode of a semiconductor element, and a current of 18 mA, for example (i.e. a drain current $I_D$) is caused to flow. In this state, while a voltage (i.e. a gate voltage) that gradually increases is being applied to the gate electrode, the voltage on the drain electrode side (i.e. a drain voltage $V_D$) is measured. At this time, the drain voltage $V_D$ drops at a gate voltage equal to the threshold voltage. By detecting the gate voltage when the drain voltage $V_D$ drops, the threshold voltage $V_{th}$ of each of the semiconductor elements 13a and 13b obtained.

As one example, it is assumed that the threshold voltages $V_{th}$ of the semiconductor elements 13a implemented in the semiconductor modules 10A to 10D are respectively obtained to be 3.51, 3.30, 2.96, and 2.89 V. Furthermore, it is assumed that the threshold voltages $V_{th}$ of the semiconductor elements 13b implemented in the semiconductor modules 10A to 10D are respectively obtained to be 2.89, 2.96, 3.30, and 3.51 V.

In step S2, the inductances of the busbars 32 and 31 are measured.

Figure 7A:
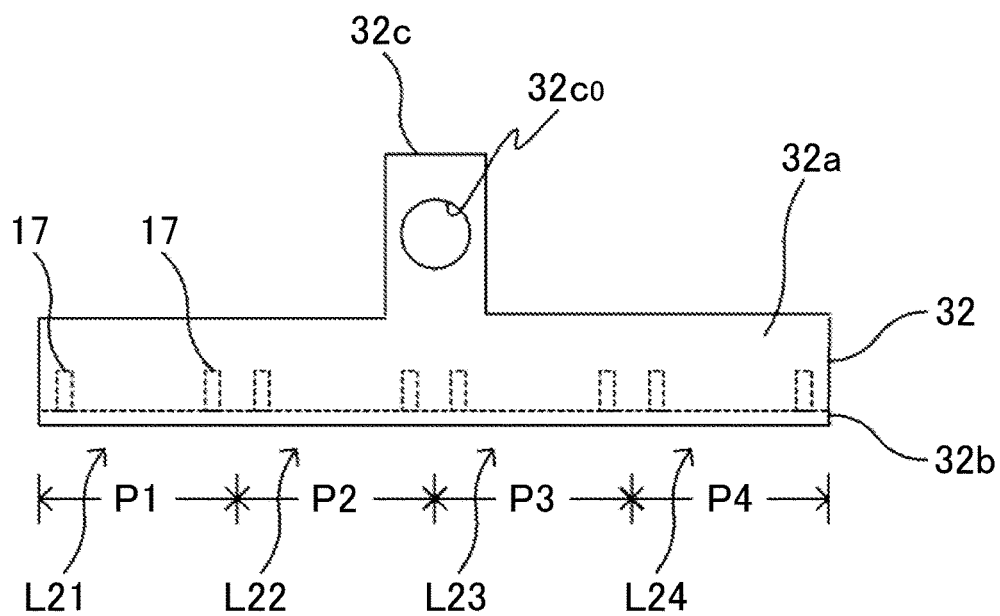
FIG. 7A shows a measurement position for the inductances of the busbar (N line).

FIG. 7A shows a measurement position for the inductances of the busbar 32 forming the N line. The inductances are measured between the terminal portion 32c used as the common terminal and respective sets of two connection points on the bonding portion 32b to which are connected the external terminals 17 (shown using dotted lines in the drawing) of the semiconductor modules 10A to 10D at the sites P1 to P4 where the semiconductor modules 10A to 10D are arranged. The parasitic inductances L21 to L24 between the terminal portion 32c and the respective connection points on the bonding portion 32b to which the external terminals 17 of the semiconductor modules 10A to 10D are connected are obtained, according to the average of the inductances measured at the two connection points corresponding to each of the sites P1 to P4.

Each inductance is obtained by, for example, applying a stepped voltage between the terminal portion 32c of the busbar 32 and a connection point on the bonding portion 32b, simultaneously measuring the change over time of the current flowing between the terminal portion 32c and the bonding portion 32b, and dividing the obtained value of the change over time by the value of the applied voltage. Alternatively, the inductance can be obtained through actual measurement using an impedance analyzer or the like or through a calculation using an electromagnetic field simulation or the like.

Figure 7B:
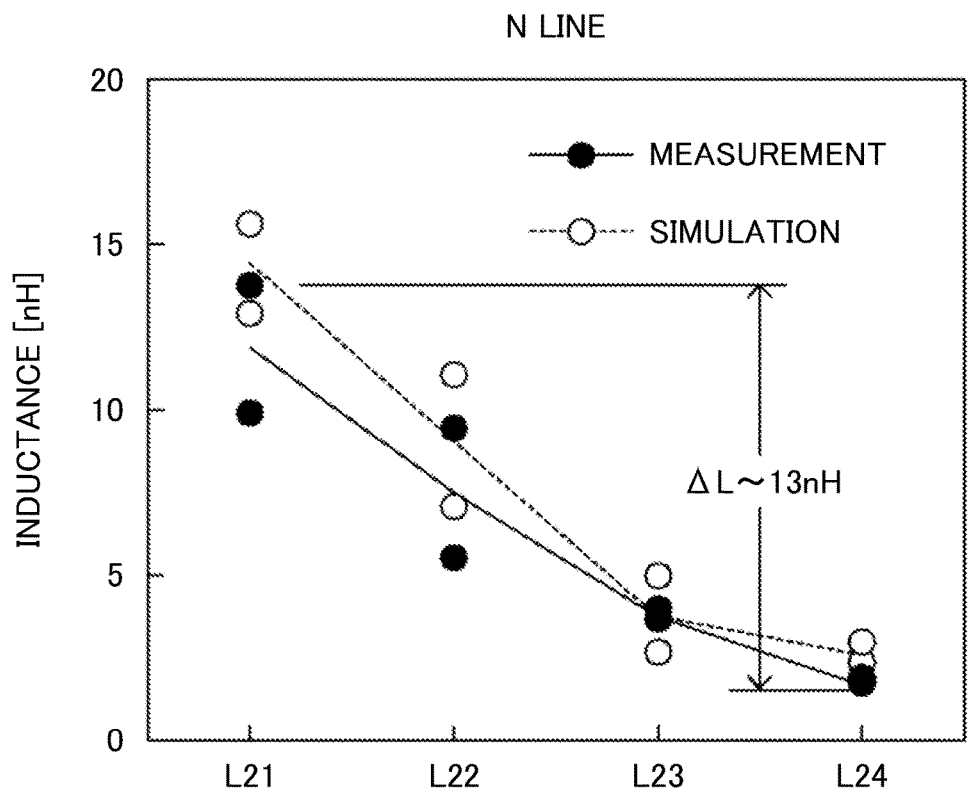
FIG. 7B shows measurement results and simulation results for the inductances of the busbar (N line).

FIG. 7B shows an example of measurement results for the inductances L21 to L24 in the busbar 32 forming the N line. In the drawing, results obtained through a simulation are shown together with the measurement results. The measurement results (or simulation results) for the inductances L21 to L24 are shown using blackened symbols (or empty white symbols) for the inductance values obtained for each set of two connection points on the bonding portion 32b corresponding to the sites P1 to P4, and using a solid line (or dashed line) for the inductance values obtained from the averages of these values. The inductances L21 to L24 are respectively obtained to be 11.8, 7.4, 3.9, and 1.9 nH, and it was found that a relationship of L21>L22>L23>L24 is established and that there is a skew ΔL in the inductance that has a maximum of approximately 13 nH.

Figure 8A:
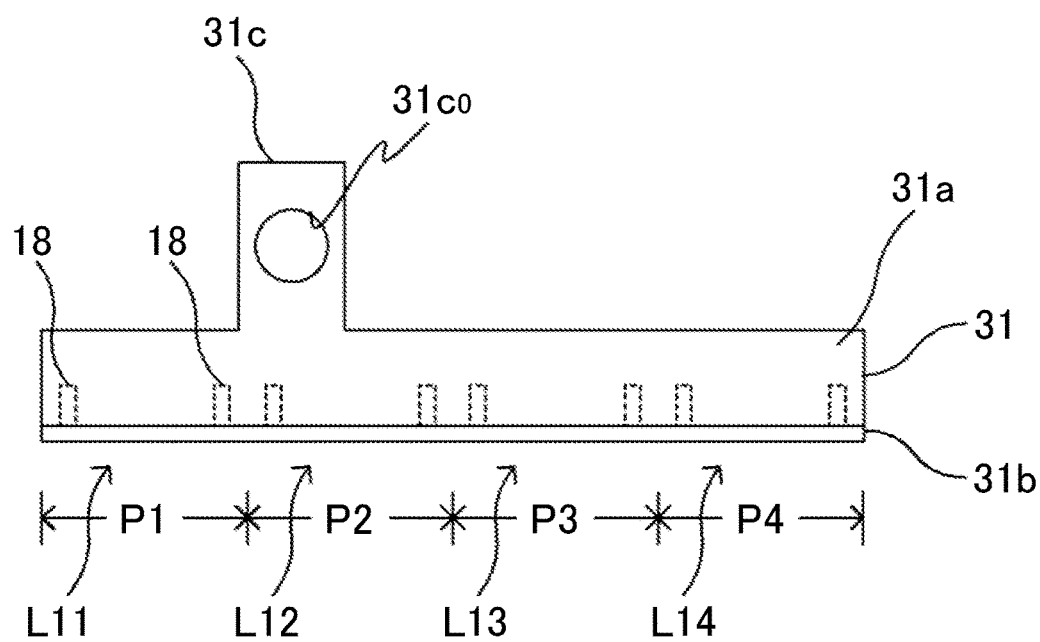
FIG. 8A shows a measurement position for the inductances of the busbar (P line).

FIG. 8A shows a measurement position for the inductances of the busbar 31 forming the P line. The inductances are measured between the terminal portion 31c used as the common terminal and respective sets of two connection points on the bonding portion 31b to which are connected the external terminals 18 (shown using dotted lines in the drawing) of the semiconductor modules 10A to 10D at the sites P1 to P4 where the semiconductor modules 10A to 10D are arranged. The parasitic inductances L11 to L14 between the terminal portion 31c and the respective connection points on the bonding portion 31b to which the external terminals 18 of the semiconductor modules 10A to 10D are connected are obtained, according to the average of the inductances measured at the two connection points corresponding to each of the sites P1 to P4.

The inductances can be measured in the same manner as described above.

Figure 8B:
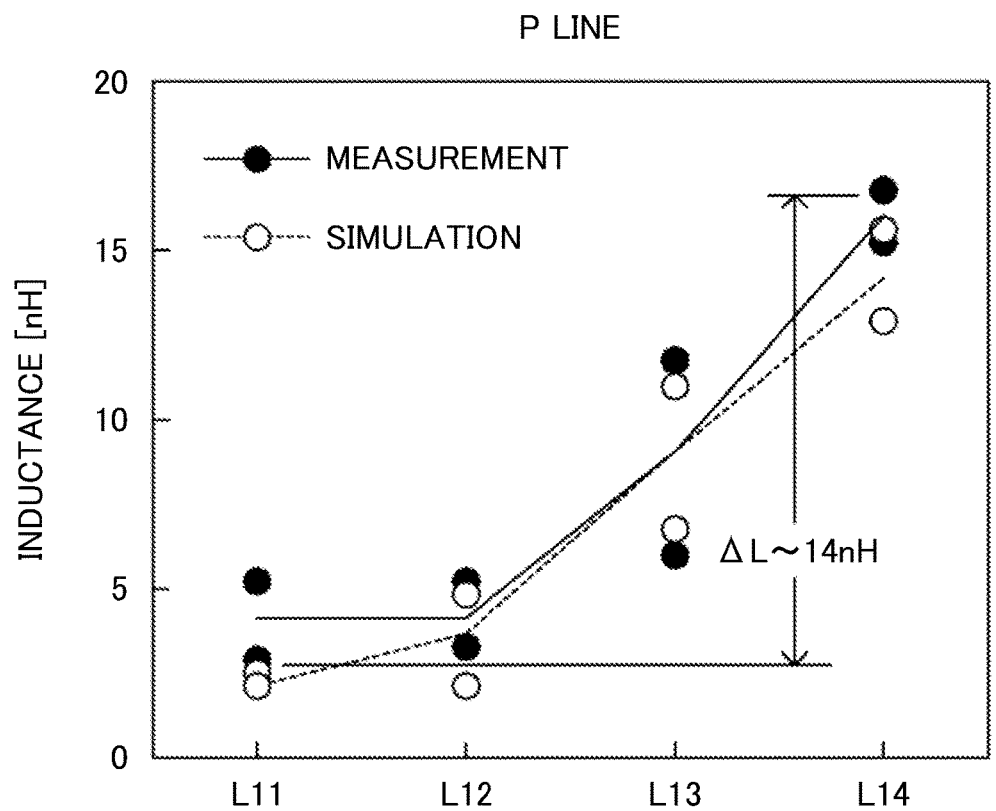
FIG. 8B shows measurement results and simulation results for the inductances of the busbar (P line).

FIG. 8B shows an example of measurement results for the inductances L11 to L14 in the busbar 31 forming the P line. In the drawing, results obtained through a simulation are shown together with the measurement results. The measurement results and simulation results for the inductances L11 to L14 are shown in the same manner as in FIG. 7B. It was found that a relationship of L11<L12<L13<L14 is established among the inductances L11 to L14, and that there is a skew ΔL in the inductance that has a maximum of approximately 14 nH.

In step S3, the semiconductor modules arranged respectively at the sites P1 to P4 are assembled. In the present embodiment, a selection concerning which of the semiconductor modules 10A to 10D a semiconductor element with a low threshold voltage $V_{th}$ will be assembled in as each of the semiconductor modules arranged at sites P1 to P4 having a high inductance is made, based on the inductances L21 to L24 of the busbar 32 (N line) and the threshold voltages $V_{th}$ of the semiconductor elements 13b of the semiconductor modules 10A to 10D. In the same manner, a selection concerning which of the semiconductor modules 10A to 10D a semiconductor element with a low threshold voltage $V_{th}$ will be assembled in as each of the semiconductor modules arranged at sites P1 to P4 having a high inductance is made, based on the inductances L11 to L14 of the busbar 31 (P line) and the threshold voltages $V_{th}$ of the semiconductor elements 13a of the semiconductor modules 10A to 10D, and the semiconductor modules 10A to 10D are assembled.

In step S4, the semiconductor modules 10A to 10D that have been assembled for the sites P1 to P4 are connected in parallel with the busbars 31 to 33. The semiconductor modules 10A to 10D are arranged respectively at the sites P1 to P4 according to the optimal arrangement determined in step S3, and the external terminals 18 to 16 are connected at the connection points on the bonding portion 31b to 33b of the busbars 31 to 33.

Furthermore, the print substrate 34 is connected to the external terminals 19 of the semiconductor modules 10A to 10D, and the semiconductor modules 10A to 10D, the busbars 31 to 33, and the print substrate 34 are covered from above by the case (not shown) to be housed therein. In this way, the manufacturing of the semiconductor device 100 is finished.

Figure 9B:
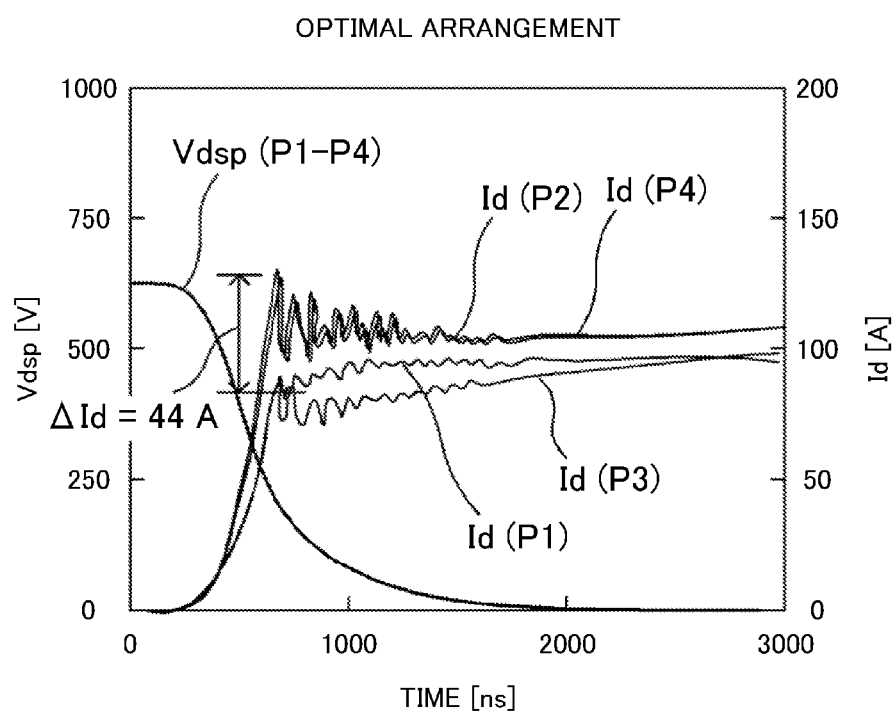
FIG. 9B shows an example of results of a current imbalance test (measurement results for the transient characteristics including the drain current and the drain-source voltage when the conduction is ON) for the semiconductor device in which the semiconductor modules have the optimal arrangement.

FIGS. 9A and 9B show exemplary results of a current imbalance test for the semiconductor device 100 in which the semiconductor modules 10A to 10D have the optimal arrangement as described above. In the current imbalance test, in the circuit configuration shown in FIG. 3, a direct current source was connected between the external terminals 18 and the external terminals 17, a coil was connected between the external terminals 18 and the external terminals 16, and a general chopper circuit was used to turn the conduction of the semiconductor elements 13b ON and OFF. In the current imbalance test, for each of the conduction OFF state (OFF) and the conduction ON state (ON), transient characteristics including the drain current Id, the gate-source voltage Vgsp, and the drain-source voltage Vdsp (only when the conduction is OFF) of each of the semiconductor modules 10A to 10D are measured. The largest value of the drain current Id, the largest value of the gate-source voltage Vgsp, and the largest value of the drain-source voltage Vdsp (only when the conduction is OFF) of the semiconductor modules 10A to 10D arranged respectively at the sites P1 to P4 are gathered in the table shown in FIG. 9A. FIG. 9B shows the transient characteristics including the drain current Id and the drain-source voltage Vdsp of the semiconductor modules 10A to 10D arranged respectively at the sites P1 to P4, when the conduction is ON.

As understood from FIG. 9B, by turning conduction ON at a time of 200 ns (input of the switching voltage meaning an ON signal), the drain-source voltages Vdsp of the semiconductor modules 10A to 10D (P1 to P4) each attenuate monotonically from the ON voltage value and reach nearly zero after a time of 2000 ns has passed. In contrast, when conduction is ON, the drain current Id of the semiconductor modules 10A to 10D (P1 to P4) rises suddenly according to the respective inductances in the current paths from the common terminal of the busbar 32 to the semiconductor modules 10A to 10D, thereby causing an overshoot, and after this small fluctuations repeat in the drain current Id and the drain current Id becomes saturated at different current amounts determined by the ON resistances of the respective modules. Here, the value of the largest drain current (also referred to as a largest peak current) that accompanies the overshoot is 84 A, 112 A, 94 A, and 128 A respectively for the semiconductor modules 10A to 10D arranged respectively at the sites P1 to P4, indicating a variation of 44 A in the drain current in the transient state of the semiconductor modules 10A to 10D.

Figure 10B:
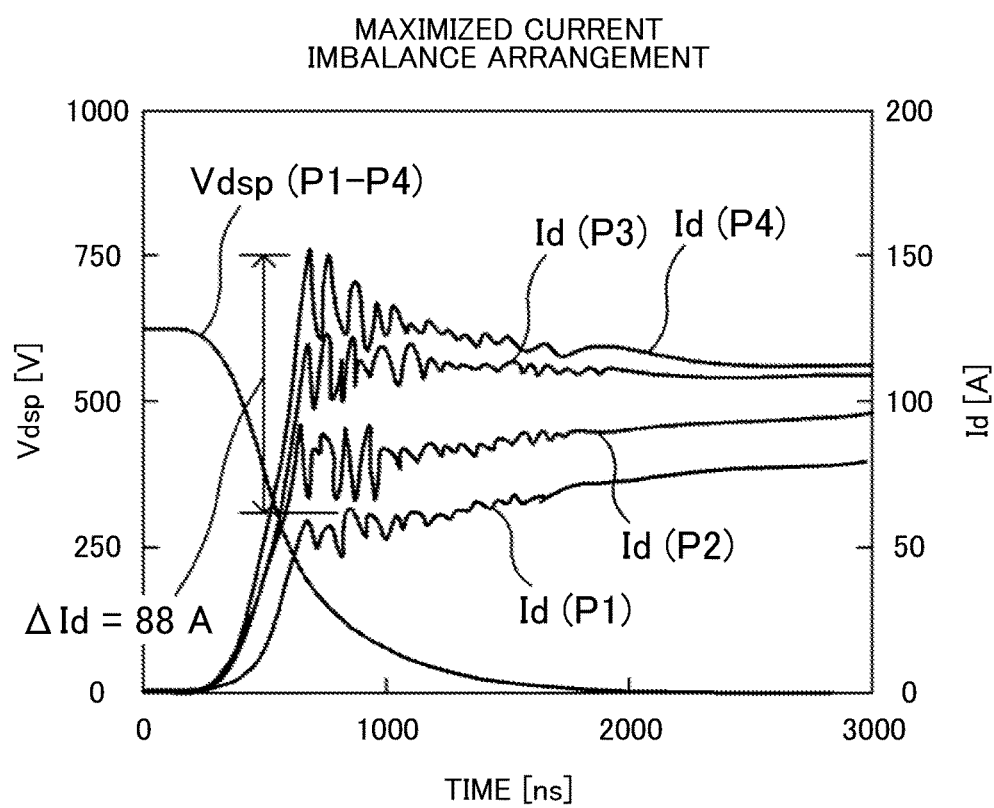
FIG. 10B shows an example of results of a current imbalance test (measurement results for the transient characteristics including the drain current and the drain-source voltage when the conduction is ON) for the semiconductor device according to the comparative example.

FIGS. 10A and 10B show exemplary results of a current imbalance test for a semiconductor device 100 in which the semiconductor modules 10A to 10D do not have the optimal arrangement, as a comparative example. In the comparative example, the semiconductor modules 10A to 10D having a high threshold voltage $V_{th}$ are selected for a high inductance, based on the inductances L21 to L24 of the busbar 32 (N line) and the threshold voltage $V_{th}$ of the semiconductor elements 13b of the semiconductor modules 10A to 10D, thereby adopting an arrangement that maximizes the current imbalance. The largest value of the drain current Id, the largest value of the gate-source voltage Vgsp, and the largest value of the drain-source voltage Vdsp (only when the conduction is OFF) of the semiconductor modules 10A to 10D arranged respectively at the sites P1 to P4 are gathered in the table shown in FIG. 10A. FIG. 10B shows the transient characteristics including the drain current Id and the drain-source voltage Vdsp of the semiconductor modules 10A to 10D arranged respectively at the sites P1 to P4, when the conduction is ON.

As understood from FIG. 10B, by turning conduction ON at a time of 200 ns (input of the switching voltage meaning an ON signal), the drain-source voltages Vdsp of the semiconductor modules 10A to 10D (P1 to P4) each attenuate monotonically from the ON voltage value and reach nearly zero after a time of 2000 ns has passed. In contrast, when conduction is ON, the drain current Id of the semiconductor modules 10A to 10D (P1 to P4) rises suddenly according to the inductances in the busbar, thereby causing an overshoot, and after this small fluctuations repeat in the drain current Id and the drain current Id becomes saturated at different current amounts determined by the ON resistances of the respective modules. Here, the value of the largest drain current (also referred to as a largest peak current) that accompanies the overshoot is 61 A, 93 A, 125 A, and 149 A respectively for the semiconductor modules 10A to 10D arranged respectively at the sites P1 to P4, indicating a variation of 88 A in the drain current in the transient state of the semiconductor modules 10A to 10D.

The same results as described above are obtained for the current variation relating to the semiconductor elements 13A by using the optimal arrangement, for each inductance of a current path from the common terminal of the busbar 31 (P line) to the semiconductor modules of the 10A to 10D.

Accordingly, by optimizing the arrangement of the semiconductor modules such that the semiconductor elements in a second semiconductor module having a lower threshold voltage than the semiconductor elements in a first semiconductor module are connected at a connection point where the inductance between the terminal portion and the second semiconductor module is greater than between the terminal portion and the connection point of the first semiconductor module on the busbar, based on the inductance of the busbar and the threshold voltage of the semiconductor elements in the semiconductor module, the second semiconductor module assembled from the semiconductor elements having a low threshold voltage is turned ON faster than the first semiconductor module assembled from the semiconductor elements having a high threshold voltage according to the input of a common switching voltage but the rising of the drain current is restricted by the high inductance of the busbar, and the first semiconductor module is turned ON slower than the second semiconductor module but encourages the rising of the drain current due to the low impedance of the busbar, thereby making it possible to minimize the variation of the largest peak current, i.e. the current imbalance, when the conduction is ON.

When the conduction is OFF as well, the drain current of the semiconductor modules experiences variation in the smallest value, i.e. current imbalance, caused by an undershoot, but with the optimal arrangement according to the present embodiment, it is possible to minimize the current imbalance such that the drain current variation is 57A for the comparative example shown in FIG. 10A and the drain current variation is 46 A for the optimal arrangement shown in FIG. 9A.

In the present embodiment, the optimal arrangement of the semiconductor modules 10A to 10D is determined based on the inductances L11 to L14 and L21 to L24 of the busbar 31 (P line) and the busbar 32 (N line). Furthermore, the optimal arrangement may be determined based on the total inductance that takes into consideration the inductances L1 to L4 (the inductances from the external terminals 18 to the semiconductor elements 13a (not shown)) and the inductances L5 to L8 (the inductances from the external terminals 17 to the semiconductor elements 13b (not shown)) respectively in the semiconductor modules 10A to 10D, e.g. the inductances L11+L1 to L14+L4 for the busbar 31 (P line) and the inductances L21+L5 to L24+L8 for the busbar 32 (N line). In this way, the current imbalance can be further restricted.

Figure 11:
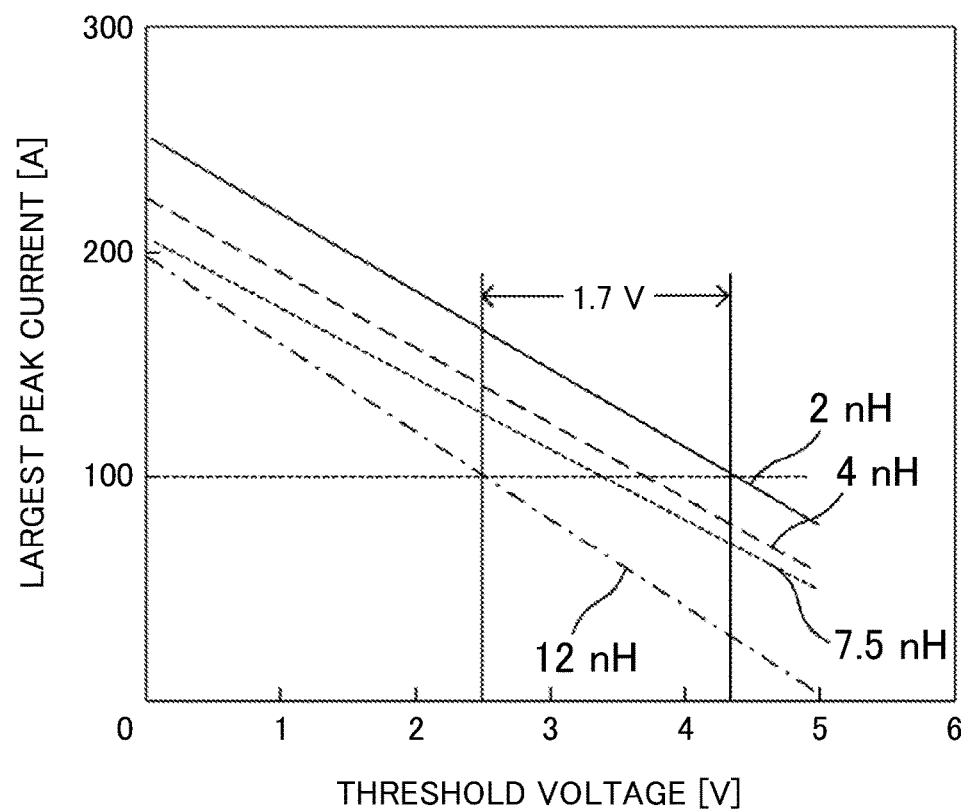
FIG. 11 shows a relationship between the largest peak current and the threshold voltage of a semiconductor module.

FIG. 11 shows a relationship between the threshold voltage of a semiconductor element and the largest value (i.e. the largest peak current) of the drain current conducted through the semiconductor module having this threshold voltage, for the inductance of the busbar. This relationship can be obtained by performing the current imbalance test with the semiconductor elements in the semiconductor modules 10A to 10D having threshold voltages (respective threshold voltages of 3.51, 3.30, 2.96, and 2.98 V) connected at the connection points (corresponding to inductances of 2, 4, 7.5, and 12 nH) on the bonding portion 31b of the busbar 31 (P line) corresponding to the sites P1 to P4. The largest peak current behaves in a manner to decrease linearly with respect to the threshold voltage, for any inductance value. Here, to make the largest peak currents uniform at 100 A, it is only necessary to select semiconductor elements such that the semiconductor element at the site P1 (corresponding to an inductance of 2 nH) has a threshold voltage of 3.7 V, the semiconductor element at the site P2 (corresponding to an inductance of 4 nH) has a threshold voltage of 3.4 V, the semiconductor element at the site P3 (corresponding to an inductance of 7.5 nH) has a threshold voltage of 3.1 V, and the semiconductor element at the site P4 (corresponding to an inductance of 12 nH) has a threshold voltage of 2.5 V. It should be noted that a variation of 1.7 V is needed in the threshold voltages of the semiconductor modules.

Figure 12:
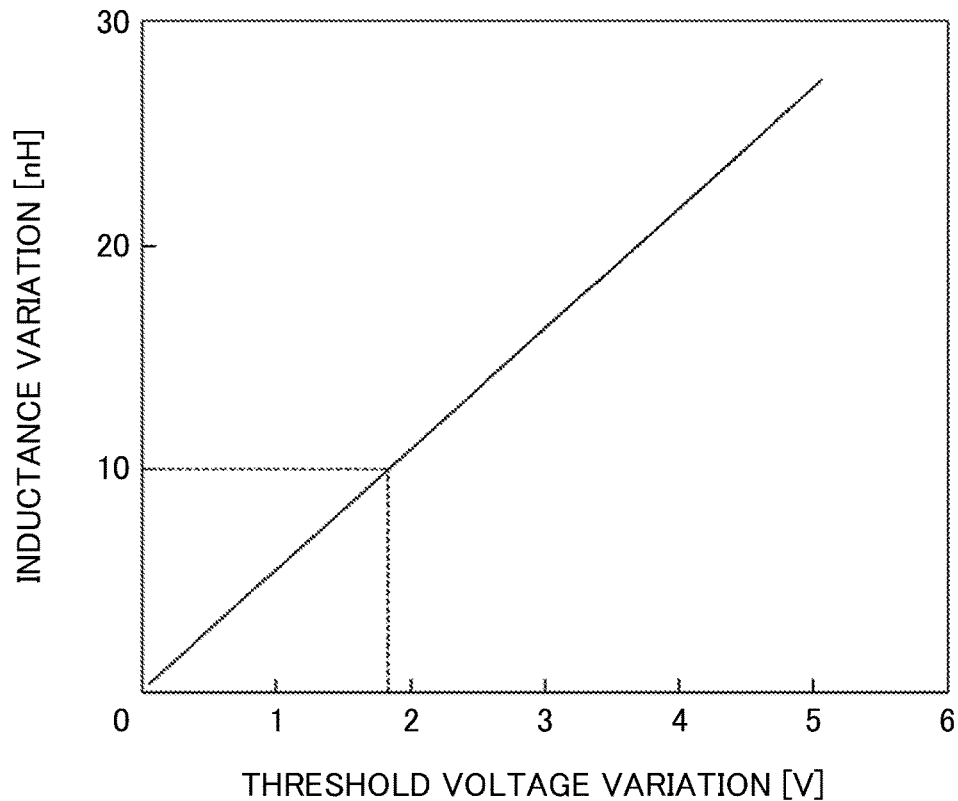
FIG. 12 shows the relationship between the variation of the threshold voltages of the semiconductor modules connected in parallel and the variation of the inductances of the busbars.

FIG. 12 shows the relationship between the variation of the threshold voltages of the semiconductor modules connected in parallel and the variation of the inductances of the busbars. This relationship is obtained from the relationship between the largest peak current and the threshold voltage of the semiconductor modules for the inductances of the busbars shown in FIG. 11. For example, for an inductance variation of 10 nH in the busbar 32, a threshold voltage variation of 1.7 V in the semiconductor modules is needed to achieve a uniform largest peak current of 100 A, thereby obtaining a first-order curve passing through the origin.

When the number of semiconductor modules connected in parallel is increased, the connection points to which semiconductor modules are connected are spread across a wider range of the busbars and the inductance variation becomes larger, and therefore, in order to restrict the current imbalance, it is necessary to use a plurality of semiconductor elements having a large variation in threshold voltage, i.e. significantly different threshold voltages, in the semiconductor modules. In the semiconductor device 100 according to the present embodiment, four semiconductor modules 10A to 10D are arranged in parallel with the busbar 31 having an inductance variation of 10 nH. From FIG. 12, it is understood that the threshold voltage variation of the semiconductor elements 13a of the semiconductor modules 10A to 10D needed to restrict the current imbalance is 1.8 V. From this relationship, it is understood that if semiconductor elements having threshold voltages from 1.5 V to 6.5 V can be manufactured, it is possible to connect a maximum of nine semiconductor modules in parallel using the busbar 31.

The present embodiment includes an upper arm and a lower arm in each semiconductor module (2 in 1), but even if only one arm is included (1 in 1), the threshold voltages of the semiconductor elements to be assembled in the semiconductor modules may be selected relative to the inductance values for the inductance value of the busbar 31 (P line) relative to each semiconductor module to perform assembly with the optimal arrangement.

Figure 13:
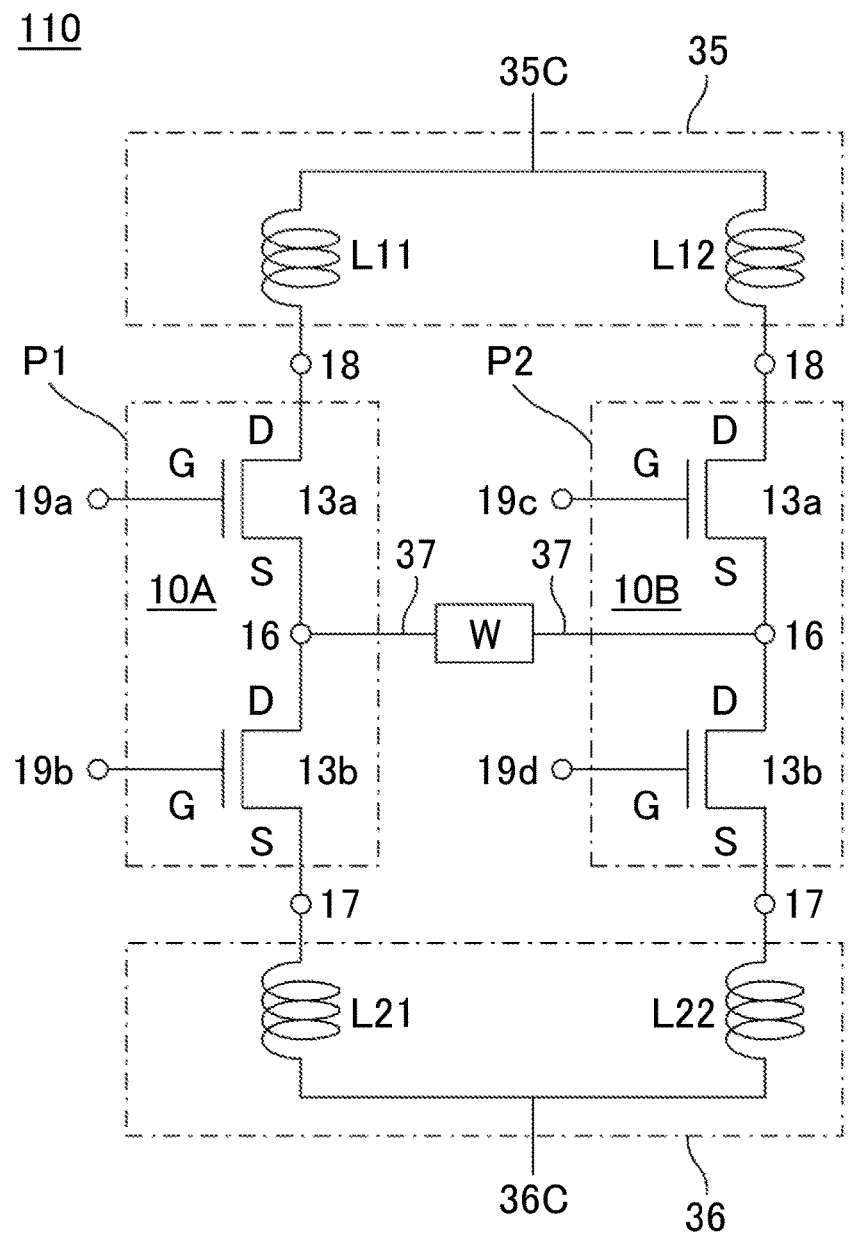
FIG. 13 shows a circuit configuration of the semiconductor device according to a modification.

FIG. 13 shows a circuit configuration of a semiconductor device 110 according to a modification. The semiconductor device 110 is configured in the same manner as the semiconductor device 100 described above, except that the semiconductor device 110 includes two semiconductor modules 10A and 10B and a load W is connected between these modules. Therefore, detailed descriptions of configurations that are identical to or correspond to configurations in the semiconductor device 100 are omitted.

The semiconductor device 110 includes the semiconductor modules 10A and 10B, busbars 35 and 36, wiring 37, and the print substrate (not shown). The semiconductor device 110 is used as an inverter corresponding to one phase (e.g. a W phase) of a motor in an inverter apparatus driving a motor.

The semiconductor device 110 is used by being incorporated in an external apparatus or the like (not shown), and operates according to a switching voltage or the like or according to a control signal from the external apparatus or the like. In the semiconductor device 110, positions where the semiconductor modules 10A and 10B are arranged relative to the busbars 35 and 36 are the sites P1 and P2.

The semiconductor modules 10A and 10B are configured in the same manner as the semiconductor modules described above. Each of the semiconductor modules 10A and 10B has a unique threshold voltage, and receives a switching voltage greater than or equal to the threshold voltage to conduct electricity or receives a switching voltage less than the threshold voltage to stop conducting electricity. The semiconductor modules 10A and 10B are respectively arranged at the sites P1 and P2, and are connected in parallel by the busbars 35 and 36 describe below.

The busbars 35 and 36 are configured in the same manner as the busbars 31 and 32 described above, and connect the semiconductor modules 10A and 10B in parallel with common terminals 35c and 36c thereof. The busbar 35 is connected to each set of two external terminals 18 in each of the semiconductor modules 10A and 10B. The busbar 36 is connected to each set of two external terminals 17 in each of the semiconductor modules 10A and 10B. The busbars 35 and 36 achieve mutual inductance by having body portions thereof opposite each other and close to each other.

In the busbar 35, parasitic inductances L11 and L12 occur between the terminal portion 35c and the respective connection points on the bonding portion where the external terminals 18 of the semiconductor modules 10A and 10B are connected. In the busbar 36, parasitic inductances L21 and L22 occur between the terminal portion 36c and the respective connection points on the bonding portion where the external terminals 17 of the semiconductor modules 10A and 10B are connected.

The wiring 37 is a conductor that connects the load W between the semiconductor modules 10A and 10B, and connects the set of two external terminals 16 of each of the semiconductor modules 10A and 10B respectively to one end and another end of the load W.

The print substrate (not shown) is a substrate that is connected to the semiconductor modules 10A and 10B and inputs control signals transmitted from the external apparatus or the like to the semiconductor modules 10A and 10B. The print substrate (not shown) is connected to the set of four external terminals 19 of each of the semiconductor modules 10A and 10B. Here, the gate electrodes of the semiconductor elements 13a and 13b included in the semiconductor module 10A are connected to the external terminals 19a and 19b included among the external terminals 19, and the gate electrodes of the semiconductor elements 13a and 13b included in the semiconductor module 10B are connected to the external terminals 19c and 19d included among the external terminals 19.

The semiconductor device 110 receives a control signal from the external apparatus or the like (not shown), and inputs the switching voltage included in the control signal to each of the semiconductor elements 13a and 13b included in the semiconductor modules 10A and 10B via the external terminals 19a to 19d. As a result, the semiconductor element 13a of the semiconductor module 10A and the semiconductor element 13b of the semiconductor module 10B are turned ON, and current is conducted toward the right to the load W along a first current path, i.e. via the inductance L11 of the busbar 35 and the inductance L22 of the busbar 36. Furthermore, the semiconductor element 13a of the semiconductor module 10B and the semiconductor element 13b of the semiconductor module 10A are turned ON, and current is conducted toward the left to the load W along a second current path, i.e. via the inductance L12 of the busbar 35 and the inductance L21 of the busbar 36.

In the semiconductor device 110 having the configuration described above, the sum of the inductance L11 of the busbar 35 and the inductance L22 of the busbar 36 is set to be smaller than the sum of the inductance L12 of the busbar 35 and the inductance L21 of the busbar 36. In this case, the two semiconductor modules 10A and 10B are selected such that the threshold voltage of the semiconductor element 13a of the semiconductor module 10A is higher than the threshold voltage of the semiconductor element 13a of the semiconductor module 10B and the threshold voltage of the semiconductor element 13b of the semiconductor module 10A is lower than the threshold voltage of the semiconductor element 13b of the semiconductor module 10B, and these semiconductor modules 10A and 10B are connected in parallel between the busbars 35 and 36.

The semiconductor device 110 can be manufactured according to the flow of the manufacturing method shown in FIG. 6.

In step S1, a threshold voltage $V_{th}$ for the switching voltage is measured for each of the semiconductor elements 13a and 13b implemented in the semiconductor modules 10A and 10B. The details of the threshold voltage measurement method are as described above.

In step S2, the inductances of the busbars 35 and 36 are measured. The details of the inductance measurement process are as described above.

In step S3, the semiconductor modules arranged respectively at the sites P1 and P2 are assembled. In the present modification, a selection concerning which of the semiconductor modules 10A and 10B a semiconductor element having a suitable threshold voltage $V_{th}$ will be assembled in is made such that the a semiconductor element having a low threshold voltage is arranged in a current path having a high inductance, based on the inductances L11 and L12 of the busbar 35, the inductances L21 and L22 of the busbar 36, and the threshold voltages $V_{th}$ of the semiconductor elements 13a and 13b of the semiconductor modules 10A and 10B, and the semiconductor modules 10A and 10B are assembled.

In the present modification, the inductance of the first current path is provided by the sum L11+L22 of the inductance L11 of the busbar 35 and the inductance L22 of the busbar 36, the inductance of the second current path is provided by the sum L12+L21 of the inductance L12 of the busbar 35 and the inductance L21 of the busbar 36, and L11+L22<L12+L21, as described above. Therefore, when the semiconductor module 10A is to be arranged at the site P1, the semiconductor module 10A is assembled and, as the semiconductor module 10B arranged at the site P2, a semiconductor module is assembled that includes a semiconductor element 13a having a lower threshold voltage than the semiconductor element 13a of the semiconductor module 10A and a semiconductor element 13b having a higher threshold voltage than the semiconductor element 13b of the semiconductor module 10A.

In step S4, the semiconductor modules 10A and 10B that have been assembled for the sites P1 and P2 are connected in parallel with the busbars 31 and 32. The semiconductor modules 10A and 10B are arranged respectively at the sites P1 and P2 according to the optimal arrangement determined in step S3, and the external terminals 18 and 17 are connected at the connection points on the bonding portion of each of the busbars 35 and 36.

Furthermore, the load W is connected between the external terminals 16 of the semiconductor modules 10A and 10B via the wiring 37, the print substrate (not shown) is connected to the external terminals 19 of the semiconductor modules 10A and 10B, and the semiconductor modules 10A and 10B, the busbars 35 and 36, and the print substrate 34 are covered from above by the case (not shown) to be housed therein. In this way, the manufacturing of the semiconductor device 110 is finished.

In this way, the semiconductor element 13a of the semiconductor module 10A and the semiconductor element 13b of the semiconductor module 10B having high threshold voltage and positioned in the first current path are turned ON slower than the semiconductor element 13a of the semiconductor module 10B and the semiconductor element 13b of the semiconductor module 10A having low threshold voltage and positioned in the second current path for the input of a common switching current, but rising of the conducted current is encouraged by the low inductance L11+L22 of the first current path. Furthermore, the semiconductor element 13a of the semiconductor module 10B and the semiconductor element 13b of the semiconductor module 10A having low threshold voltage and positioned in the second current path are turned ON faster than the semiconductor element 13a of the semiconductor module 10A and the semiconductor element 13b of the semiconductor module 10B having high threshold voltage and positioned in the first current path for the input of a common switching current, but rising of the conducted current is restricted by the high inductance L12+L21 of the second current path. In this way, it possible to minimize the variation of the largest peak current, i.e. the current imbalance, when the conduction is ON.

In the semiconductor device 100 according to the present embodiment and the semiconductor device 110 according to the modification, each of the semiconductor modules 10A to 10D includes a set of two semiconductor electrodes 13a and 13b, but instead, semiconductor elements 13a may be connected in series and/or in parallel between the external terminals 18 and 16 and semiconductor elements 13b may be connected in series and/or in parallel between the external terminals 16 and 17, for example. In this case, the threshold voltage of the semiconductor elements connected in series and/or in parallel can be characterized by the average or the highest threshold voltage among the threshold voltages of the individual elements.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a first semiconductor module housing a first semiconductor element and a third semiconductor element;
   a second semiconductor module housing a second semiconductor element and a fourth semiconductor element, the second semiconductor element having a switching voltage threshold that is lower than a switching voltage threshold of the first semiconductor element of the first semiconductor module, and the fourth semiconductor element having a switching voltage threshold that is higher than a switching voltage threshold of the third semiconductor element of the first semiconductor module; and
   a first busbar that connects an external terminal of the first semiconductor element of the first semiconductor module to an external terminal of the second semiconductor element of the second semiconductor module in parallel to a first common terminal; and
   a second busbar that connects an external terminal of the third semiconductor element of the first semiconductor module to an external terminal of the fourth semiconductor element of the second semiconductor module in parallel to a second common terminal, wherein
   an inductance of a current path from the first common terminal to the first semiconductor element in the first semiconductor module is lower than an inductance of a current path from the first common terminal to the second semiconductor element in the second semiconductor module, and
   an inductance of a current path from the second common terminal to the third semiconductor element of the first semiconductor module is higher than an inductance of a current path from the second common terminal to the fourth semiconductor element of the second semiconductor module.

2. The semiconductor device according to claim 1, wherein
a total of an inductance between the connection point of the second semiconductor module and the common terminal on the first busbar, and an inductance of a current path to the second semiconductor element in the second semiconductor module,
is greater than a total of an inductance between the connection point of the first semiconductor module and the common terminal on the first busbar, and an inductance of a current path to the first semiconductor element in the first semiconductor module.

3. The semiconductor device according to claim 1, wherein
the first semiconductor element and the third semiconductor element are connected in parallel at a connection point on the first busbar,
the second semiconductor element and the fourth semiconductor element are connected in parallel at a connection point on the second busbar, and
the switching voltage thresholds of the second semiconductor element and fourth semiconductor element are lower than the switching voltage thresholds of the first semiconductor element and the third semiconductor element in an average value or a largest value.

4. The semiconductor device according to claim 1, wherein
a difference between the switching voltage threshold of the first semiconductor element housed in the first semiconductor module and the switching voltage threshold of the second semiconductor element housed in the second semiconductor module is inversely related to a difference between inductances of current paths from the common terminal of the first busbar to the connection points of the respective first and second semiconductor modules.

5. The semiconductor device according to claim 1, wherein
the first busbar and the second busbar are arranged such that portions thereof in which current flows in opposite directions are opposite each other.

6. A method of manufacturing the semiconductor device according to claim 1, comprising:
measuring the switching voltage threshold of each semiconductor element housed in a plurality of semiconductor modules;
selecting as the first semiconductor element housed in the first semiconductor module from among the plurality of semiconductor elements, and selecting as the second semiconductor element with a lower switching voltage threshold than the first semiconductor element housed in the first semiconductor module to be housed in the second semiconductor module;
connecting the first semiconductor module to a connection point on the first busbar; and
connecting the second semiconductor module to a connection point on the first busbar at which an inductance relative to the common terminal is higher than that of the first semiconductor module.

7. The semiconductor device manufacturing method according to claim 6, further comprising:
assembling the first semiconductor module and the second semiconductor module;
measuring inductances from the common terminal of the first busbar to the connection points of the respective first semiconductor module and the second semiconductor module; and
determining a difference that can be allowed between the switching voltage thresholds of the first semiconductor element and the second semiconductor element, according to a difference between the inductances from the common terminal of the first busbar to the connection points of the respective first semiconductor module and second semiconductor module.

8. A semiconductor device comprising:
a first semiconductor module;
a second semiconductor module housing a second semiconductor element that has a switching voltage threshold that is lower than a switching voltage threshold of a first semiconductor element of the first semiconductor module; and
a busbar that connects respective external terminals of the first semiconductor module and the second semiconductor module in parallel to a common terminal, wherein
the second semiconductor module is connected to a connection point on the busbar at which an inductance of a current path to the common terminal is greater than an inductance of a current path from a connection point of the first semiconductor module to the common terminal, wherein
a difference between the switching voltage threshold of the first semiconductor element housed in the first semiconductor module and the switching voltage threshold of the second semiconductor element housed in the second semiconductor module is inversely related to a difference between inductances of current paths from the common terminal of the busbar to the connection points of the respective semiconductor modules, and
when the difference between the switching voltage threshold of the first semiconductor element housed in the first semiconductor module and the switching voltage threshold of the second semiconductor element housed in the second semiconductor module is 1.8 V, the difference between inductances of current paths from the common terminal of the busbar to the connection points of the respective semiconductor modules is 10 nH.

9. A semiconductor device comprising:
a first semiconductor module and a second semiconductor module that each include a first semiconductor element connected between a first external terminal and a second external terminal and a second semiconductor element connected between the second external terminal and a third external terminal;
a first busbar that connects the first external terminal of the first semiconductor module and the first external terminal of the second semiconductor module in parallel to a first common terminal;
a second busbar that connects the second external terminal of the first semiconductor module and the second external terminal of the second semiconductor module in parallel to a second common terminal; and
a third busbar that connects the third external terminal of the first semiconductor module and the third external terminal of the second semiconductor module in parallel to a third common terminal, wherein the first semiconductor element of the first semiconductor module has a higher switching voltage threshold than the first semiconductor element of the second semiconductor module, the second semiconductor element of the first semiconductor module has a lower switching voltage threshold than the second semiconductor element of the second semiconductor module, an inductance of a current path from the first common terminal to the first semiconductor element in the first semiconductor module is lower than an inductance of a current path from the first common terminal to the first semiconductor element in the second semiconductor module, and an inductance of a current path from the third common terminal to the second semiconductor element of the first semiconductor module is higher than an inductance of a current path from the third common terminal to the second semiconductor element of the second semiconductor module.

10. The semiconductor device according to claim 9, wherein a difference between the switching voltage threshold of the first semiconductor element housed in the first semiconductor module and the switching voltage threshold of the first semiconductor element housed in the second semiconductor module is determined according to a difference between inductances of current paths from the first common terminal to the respective first semiconductor elements, and a difference between the switching voltage threshold of the second semiconductor element housed in the first semiconductor module and the switching voltage threshold of the second semiconductor element housed in the second semiconductor module is determined according to a difference between inductances of current paths from the third common terminal to the respective second semiconductor elements.

11. The semiconductor device according to claim 10, wherein when the difference between the switching voltage threshold of the first semiconductor element housed in the first semiconductor module and the switching voltage threshold of the first semiconductor element housed in the second semiconductor module is 1.8 V, the difference between inductances of current paths from the first common terminal to the respective first semiconductor elements is 10 nH, and when the difference between the switching voltage threshold of the second semiconductor element housed in the first semiconductor module and the switching voltage threshold of the second semiconductor element housed in the second semiconductor module is 1.8 V, the difference between inductances of current paths from the third common terminal to the respective second semiconductor elements is 10 nH.

12. The semiconductor device according to claim 9, wherein the first busbar and the third busbar are arranged such that portions thereof in which current flows in opposite directions are opposite each other.

13. The semiconductor device according to claim 9, wherein the first semiconductor module and the second semiconductor module each include a plurality of the first semiconductor elements and the second semiconductor elements, the plurality of first semiconductor elements of the first semiconductor module has a higher switching voltage threshold than the plurality of first semiconductor elements of the second semiconductor module, and the plurality of second semiconductor elements of the first semiconductor module has a lower switching voltage threshold than the plurality of second semiconductor elements of the second semiconductor module.

14. A method of manufacturing the semiconductor device according to claim 9, comprising:

measuring the switching voltage threshold of each semiconductor element housed in a plurality of the semiconductor modules;

selecting, from among the plurality of semiconductor elements, a first semiconductor element housed in the first semiconductor module and a second semiconductor element housed in the first semiconductor module, a first semiconductor element with a lower switching voltage threshold than the first semiconductor element housed in the first semiconductor module to be housed in the second semiconductor module, and a second semiconductor element with a higher switching voltage threshold than the second semiconductor element housed in the first semiconductor module to be housed in the second semiconductor module;

connecting the first external terminal of the first semiconductor module to the first busbar and connecting the third external terminal of the first semiconductor module to the third busbar; and connecting the first external terminal of the second semiconductor module to the first busbar and connecting the third external terminal of the second semiconductor module to the third busbar, wherein an inductance of a current path from the first common terminal to the first semiconductor element in the first semiconductor module is made lower than an inductance of a current path to the second semiconductor element in the second semiconductor module, and an inductance of a current path from the third common terminal to the second semiconductor element of the first semiconductor module is made higher than an inductance of a current path from the third common terminal to the second semiconductor element of the second semiconductor module.

15. The semiconductor device manufacturing method according to claim 14, further comprising:

assembling the first semiconductor module and the second semiconductor module;

measuring inductances from the common terminals of the first busbar and the third busbar to the connection points of the respective semiconductor modules;

determining a difference between the switching voltage thresholds of the first semiconductor element and the second semiconductor element housed in the respective semiconductor modules, according to a difference between the inductances from the common terminal of the first busbar to the connection points of the respective semiconductor modules; and determining a difference between the inductances from the common terminal of the third busbar to the connection points of the respective semiconductor modules and a difference between the switching voltage thresholds of the first semiconductor element and the second semiconductor element housed in the respective semiconductor modules.

16. A semiconductor device comprising:

a first semiconductor module including a first semiconductor device connected between a first external terminal and a second external terminal, and a second semiconductor device connected between the second external terminal and a third external terminal;

a second semiconductor module including a first semiconductor device connected between a first external terminal and a second external terminal and a second semiconductor device connected between the second external terminal and a third external terminal;

a first busbar that connects the first external terminal of the first semiconductor module and the first external terminal of the second semiconductor module in parallel to a first common terminal;

a second busbar that connects the third external terminal of the first semiconductor module and the third external terminal of the second semiconductor module in parallel to a second common terminal, wherein the first semiconductor device of the first semiconductor module has a higher switching voltage threshold than the first semiconductor device of the second semiconductor module, the second semiconductor device of the first semiconductor module has a lower switching voltage threshold than the second semiconductor device of the second semiconductor module, and an inductance of a current path from the first common terminal, through the first semiconductor device in the first semiconductor module and the second semiconductor device in the second semiconductor module, to the second common terminal, is lower than an inductance of a current path from the first common terminal, through the first semiconductor device in the second semiconductor module and the second semiconductor device in the first semiconductor module, to the second common terminal.

17. A method of manufacturing the semiconductor device according to claim 16, comprising:

measuring the switching voltage threshold of the first semiconductor device and the second semiconductor device included in each of a plurality of the semiconductor modules;

selecting, from among the plurality of semiconductor modules, as the first semiconductor module and selecting as the second semiconductor module in which the first semiconductor device has a lower switching voltage threshold than the first semiconductor module and the second semiconductor device has a higher switching voltage threshold than the first semiconductor module;

connecting the first external terminal of the first semiconductor module to the first busbar and connecting the third external terminal of the first semiconductor module to the second busbar; and connecting the first external terminal of the second semiconductor module to the first busbar and connecting the third external terminal of the second semiconductor module to the second busbar, wherein an inductance of a current path from the first common terminal to the second common terminal through the first semiconductor device in the first semiconductor module and the second semiconductor device in the second semiconductor module is made lower than an inductance of a current path from the first common terminal to the second common terminal through the first semiconductor device in the second semiconductor module and the second semiconductor device in the first semiconductor module.

* * * * *